United States Patent
Posseme et al.

(10) Patent No.: US 9,570,317 B2
(45) Date of Patent: Feb. 14, 2017

(54) MICROELECTRONIC METHOD FOR ETCHING A LAYER

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR); UNIVERSITE JOSEPH FOURIER, Grenoble (FR)

(72) Inventors: Nicolas Posseme, Grenoble (FR); Olivier Joubert, Meylan (FR); Laurent Vallier, Meylan (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR); UNIVERSITE JOSEPH FOURIER, Grenoble (FR)

( * ) Notice: Subject to any disclaimer, the term of this patent is extended or adjusted under 35 U.S.C. 154(b) by 0 days.

(21) Appl. No.: 14/758,440

(22) PCT Filed: Dec. 20, 2013

(86) PCT No.: PCT/EP2013/077853
§ 371 (c)(1),
(2) Date: Oct. 13, 2015

(87) PCT Pub. No.: WO2014/102222
PCT Pub. Date: Jul. 3, 2014

(65) Prior Publication Data
US 2016/0035581 A1    Feb. 4, 2016

(30) Foreign Application Priority Data
Dec. 28, 2012   (FR) ...................... 1262958

(51) Int. Cl.
*H01L 21/302*   (2006.01)
*H01L 21/311*   (2006.01)
(Continued)

(52) U.S. Cl.
CPC ..... *H01L 21/31116* (2013.01); *H01L 21/0223* (2013.01); *H01L 21/02057* (2013.01);
(Continued)

(58) Field of Classification Search
CPC ............ H01L 21/31116; H01L 21/0257; H01L 21/266; H01L 21/306; H01L 21/31111; H01L 211/32133
(Continued)

(56) References Cited

U.S. PATENT DOCUMENTS

| | | | |
|---|---|---|---|
| 7,553,758 B2 * | 6/2009 | Park ................. | H01L 21/31116 257/E21.497 |
| 2004/0118805 A1 * | 6/2004 | Hareland .......... | H01L 21/26506 216/13 |

(Continued)

FOREIGN PATENT DOCUMENTS

| | | |
|---|---|---|
| DE | 103 21 494 A1 | 12/2004 |
| WO | WO 2012/166850 A2 | 12/2012 |

OTHER PUBLICATIONS

International Search Report issued Apr. 15, 2014, in PCT/EP2013/077853, filed Dec. 20, 2013.
(Continued)

*Primary Examiner* — Duy Deo
*Assistant Examiner* — Maki Angadi
(74) *Attorney, Agent, or Firm* — Oblon, McClelland, Maier & Neustadt, L.L.P.

(57) ABSTRACT

A microelectronic method for etching a layer to be etched, including: modifying the layer to be etched from a surface of the layer to be etched and over a depth corresponding to (Continued)

at least a portion of thickness of the layer to be etched to form a film, with the modifying including implanting light ions into the layer to be etched; and removing the film includes a selective etching of the film relative to at least one layer underlying the film.

28 Claims, 28 Drawing Sheets

(51) Int. Cl.
*H01L 21/306* (2006.01)
*H01L 21/3213* (2006.01)
*H01L 21/02* (2006.01)
*H01L 21/266* (2006.01)

(52) U.S. Cl.
CPC .......... *H01L 21/266* (2013.01); *H01L 21/306* (2013.01); *H01L 21/30604* (2013.01); *H01L 21/31111* (2013.01); *H01L 21/32133* (2013.01)

(58) Field of Classification Search
USPC ..... 216/37, 67; 438/513, 744, 714, 705, 738
See application file for complete search history.

(56) References Cited

U.S. PATENT DOCUMENTS

| | | |
|---|---|---|
| 2007/0243700 A1 | 10/2007 | Qin et al. |
| 2009/0140350 A1 | 6/2009 | Zhu |
| 2010/0190324 A1* | 7/2010 | Hilkene ............ H01L 21/31138 438/513 |
| 2011/0018039 A1 | 1/2011 | Zhu |
| 2011/0027957 A1* | 2/2011 | Berry .................... H01L 21/223 438/301 |
| 2011/0139748 A1 | 6/2011 | Donnelly et al. |
| 2011/0163359 A1 | 7/2011 | Zhu |
| 2012/0309114 A1 | 12/2012 | Yao et al. |

OTHER PUBLICATIONS

Yang Xia, et al., "X-ray photoelectron spectroscopic studies of black silicon for solar cell", Journal of Electron Spectroscopy and Related Phenomena, vol. 184, No. 11, XP 028442582, 2012, pp. 589-592.

Samer Banna, et al., "Pulsed high-density plasmas for advanced dry etching processes", Journal of Vacuum Science & Technology A, vol. 30, Issue 4, Jul. 1, 2012, 1 page.

Camille Petit-Etienne, et al, "Silicon recess minimization during gate patterning using synchronous plasma pulsing", Journal of Vacuum Science & Technology B Microelectronics and Nanometer Structures, vol. 30, No. 4, Jul./Aug. 2012, 1 page.

Shinichi Tachi, et al., "Low-temperature dry etching", Journal of Vacuum Science & Technology A, vol. 9, No. 796, 1991, 1 page.

"Tokyo Electron Introduces the Tactras RLSA Etch, a New Etching System for Revolutionary Breakthrough Plasma Technology", http://www.tel.com/eng/news/2010/0325_001.htm Mar. 25, 2010, 1 page.

Ed Korczynski, Monolayer Etching with Soft Plasmas, NCCAVS Plasma Applications Group Meeting at Semicion/West, http://www.avsusergroups.org/pag_pdfs/pag2010_7korczynski%20Rv.pdf, Jul. 15, 2010, 23 pages.

H. Nishino, et al., "Damage-free selective etching of Si native oxides using NH3/NF3 and SF6/H2O down-flow etching", Journal of Applied Physics, vol. 72, No. 2, Jul. 1993, 1 page.

* cited by examiner

PRIOR ART

PRIOR ART

PRIOR ART

PRIOR ART

PRIOR ART

PRIOR ART

PRIOR ART

PRIOR ART

MICROELECTRONIC METHOD FOR ETCHING A LAYER

TECHNICAL FIELD OF THE INVENTION

The present invention relates in general to etching techniques used in microelectronics and describes a new etching method.

STATE OF THE ART

The constant reduction in size of the patterns which have to be etched to achieve increasingly dense integrated circuits could not be sustained but by constantly improving the techniques of photolithography and of etching layers of materials used to make electronic integrated circuits and all kinds of other devices with micrometric or even nanometric dimensions combining optical and mechanical devices.

Historically, the first etching methods used were those called "wet etching". They consist in contacting a surface of the material to be etched with a suitable solution, capable of chemically reacting therewith, and of dissolving it. The products obtained by etching must be soluble in the etching solution so they can be removed therewith. The conventional method consists in immersing the substrate containing the device being manufactured in the etching solution.

As illustrated in FIG. 1a the patterns to be etched 110 are initially defined in a mask 120 used as a protection for the inter-pattern areas which should not be etched in the underlying layer 130. Typically, at the present time the mask 120 is a so-called hard mask. It is made of a suitable material to withstand at best the chemical etching solution. The hard mask is itself obtained by conventional processes of photolithography and development of a photosensitive resin (insolation and dissolving the resin) so as to first transfer therein the patterns to be etched. It should be noted here that for a long time, as long as made possible by the size of the patterns and the materials to be etched, the mask 120 was made of photoresist which was used directly for etching the underlying layer 130, often silicon oxide (SiO2) in this case.

Whatever the nature of the mask 120, and that of the underlying layer 130, wet etchings are characterized by the fact that they are also executed in all directions 112 from the surface 111 in contact with the etching solution. This is called isotropic etching. As illustrated in FIG. 1b the etched areas thus extend substantially in an arc under the mask 120.

As long as the patterns to be etched were large with respect to the depth of the layers to be etched, this did not significantly affect the definition of critical dimensions, or CD, of the devices to be manufactured. With reduced dimensions of the patterns 110 down to decananometric dimensions it becomes impossible, with this type of etching, to comply with such critical dimensions. The form factor of the patterns to be etched has indeed changed dramatically over years of development. The steady increase in the density of circuits is obtained mainly with a reduction in the geometry of the patterns whereas the thickness of the different layers wherein they are formed has not been reduced, by far, in the same proportion. This is visually illustrated in FIG. 1c which shows that the final width 113 of the patterns 110 is proportionally much more affected by lateral etching when these are small.

To remedy this difficulty, so-called "dry" etching by ion bombardment of the target to be etched using plasma formed in an etching chamber has been used for many years now. As the ion bombardment is substantially perpendicular to the surfaces to be etched, under optimal conditions of implementation, little or no lateral etching of the materials to be etched occurs and the critical dimensions can more easily be reached. The main advantage of this type of etching is that it can be strongly anisotropic.

It should be noted here that using anisotropic plasma etching usually implies in practice however using a hard mask since the etching selectivity for this type of etching according to the materials whereon it acts is unfortunately much lower than the one which can be obtained with wet etching. Unlike wet etching, wherein there is little or no mask consuming, dry etchings have a much lower etching selectivity between the materials exposed to ion bombardment. In particular, photoresists are then difficult to use as a mask since they would have to be deposited in very thick layers so as not to be totally consumed upon completion of etching which is then incompatible with the definition of critical dimensions (CD) in such resins.

The solution consists in making a hard mask in a material sufficiently resistant to plasma etching, and wherein the patterns to be etched are first transferred.

FIGS. 2a to 2d illustrate the various etching profiles that can be achieved in plasma. As shown in FIG. 2b, when protected by a hard mask 120, etching can be conveniently perfectly anisotropic. The flanks 131 of the pattern transferred into the layer 130 are then perpendicular to the etched surface 111.

However, as shown and discussed in the following figure, plasma etching involves a large number of parameters with complex interactions between them. Depending on the compromises adopted, partially isotropic etching profiles with curved flanks as shown in FIG. 2c or inclined flanks as shown in FIG. 2d shall also be observed.

FIG. 3 illustrates the interactions between the elements used for plasma etching. Many factors have to be taken into account to obtain anisotropic etching:

The plasma 310 formed primarily depends on the gaseous species 320 introduced into the etching chamber and determines the type of etching chemistry used. A commonly used type of chemistry is called fluorocarbon using for example trifluoromethane (CHF3).

The walls 330 of the reactor play an important role. Condensation of the gaseous species on the walls creates interactions with plasma. Both deposition and sputtering 340 of the species that are deposited thereon occur.

Obtaining an anisotropic etching involves forming a passivation layer 140 which protects the flanks throughout an etching process. The passivation layer is obtained, from the plasma, by depositing non-volatile heavy products 350 and by directly depositing 360 products from the material of the layer 130 being etched.

The products 370 obtained from spraying the etched layer flow back to essentially participate in gas plasma 310. Similarly the products 380 obtained from the consuming of the hard mask 120 also flow back to the gas plasma. Both are normally pumped out 390 of the etching chamber with the gases 320 introduced to form the plasma.

FIGS. 4a and 4b illustrate the type of anisotropic profile which can be obtained with plasma etching.

It should however be noted that the passivation layer 140 may affect the critical dimensions (CD) 410. As shown in FIG. 4b, after removing thereof with a damp cleaning (an operation similar to wet etching described above), CDs are reduced. For example, the target for the gates of the MOSFET type transistors, the acronym for "metal oxide semiconductor field effect transistor", which the active elements of an integrated circuit are mostly made of, is currently of the order of 10 nanometers whereas the passivation layer is about 1 nanometer.

Other disadvantages are entailed in plasma etching. In particular, deposits occur on the wafer containing the devices etched in the form of polymers and heavy metals from the material being etched 360 and also from the spraying of the hard mask 400, as shown in FIG. 3 of plasma 350.

Besides, many defects can be caused by the etching chamber itself and lead to significant yield reductions. As already seen, the walls of the chamber are affected by the etching operations. If they are, for example, made of yttrium oxide, yttrium fluorite may form with the gas introduced for forming plasma (fluorocarbon chemistry). To obtain reproducible results between successive etching operations and between the etching chambers these should be systematically cleaned after etching. With the reduction in the size of the patterns to be achieved, such defects associated with the chamber heavily impact the reproducibility from one batch to another and from one chamber to another.

FIGS. 5a and 5b illustrate another type of defect related to the layer 150 which is located immediately below the layer 130 to be etched. The etching selectivity with respect to the material constituting the layer 150 may be a problem. As shown in FIG. 5a the latter may be modified 152 during the etching of the layer 130 if exposed to the etching plasma.

Some etchings require a barrier layer so that the etching automatically stops when the layer 130 is completely etched. A stop on the material of the layer 150 may be difficult to control if the compositions of the materials of the layers 130 and 150 are close or if the exposure to the plasma layer 150 has damaged the surface 152. As shown in FIG. 5b, after the wet cleaning process mentioned above, a removing or sinking 154 of the material forming the layer 150 can be noted.

With the downsizing of the patterns to be etched, the constraints on the etching processes are thus always more important. Specifically:

It must be possible to obtain a high etching selectivity, i.e. to have a significant etching differential between the material to be etched and the material of the mask protecting the non-etched parts;

Anisotropic etchings wherein the vertical etching rate must be well beyond the lateral etching rate must be used more and more often;

the control of the critical dimensions must be more accurate and more particularly the damage induced by plasma etching on non-etched layers must be reduced.

Complying with such requirements needs a better control of the plasma properties in a dry etching reactof. This challenge, which is met by the current 22 nm technological node under production is even eager for the technological nodes, beyond the 22 nm one, which are currently being developed.

The critical factors to be taken into account during the plasma etching process should take into account the homogeneity of the etching processes both on the macroscopic scale, i.e. on a slice, and microscopic scale, i.e. on a chip. All the factors mentioned above must contribute to meet this goal: relationship between etching and deposition of the species in plasma; vertical etching speed according to the lateral etching speed; checking etching profiles; conditioning and cleaning of the reactor walls; forming the passivation layer protecting the flanks of the etched patterns; reducing the damage induced by plasma on non-etched layers.

FIGS. 6a-6f illustrate how the problems related to plasma etching shown in the previous figures, specifically arise when producing MOSFET transistors of the FDSOI type, the acronym referring to a technological process, widely used currently for manufacturing integrated circuits, wherein the transistors are provided with conduction channels which may be completely deprived of their carriers or "fully depleted" (FD). To achieve this result, developed substrates of the silicon-on-insulator (SOI) type are used, on the surface of which the transistors are made from a thin layer of single-crystal silicon.

FIG. 6a shows the production of the gate 610 of such a transistor being manufactured after etching the polysilicon layer 612 forming a part of the stack of layers constituting the control gate of a MOSFET transistor of the FDSOI type. As discussed above, a passivation layer 140 is formed on either side of the gate pattern which is protected by the hard mask 120. At this point, the challenge is to meet the critical dimensions 410 of the corresponding technological node in spite of the forming of the protective layer which affects the accuracy of definition of the etched patterns, as seen in the previous figures.

FIG. 6b illustrates the etching of the other layers forming the gate 610. The stack of layers forming the gate more particularly includes the thin insulating gate oxide layer 616 through which an electric field will be able to develop when a sufficient voltage is applied thereon in operation. This aims at creating a conduction channel under the gate between the source and drain electrodes which will be subsequently formed on either side. In the most recent MOSFETs a so-called "high-k/metal gate" technology i.e. the dielectric layer 616 is made of a high permittivity (high-k) insulating material covered by a metal gate (metal gate) represented by layer 614 is implemented. The risk during this step is then damaging the thin single crystal silicon layer 622 of which is exposed when etching, as seen in the preceding figures. Such layer forms the surface layer of the SOI substrate 620 from which the FDSOI type transistors are made. The surface layer 622 is based on a continuous so-called BOX oxide layer 624, the acronym for "buried oxide layer". The strength and mechanical rigidity of the assembly are provided by the layer 626 that forms the body of the SOI substrate, often called "bulk" to indicate that the starting substrate is generally made of solid silicon. This structure provides many advantages for the production of MOSFETs. In particular, it makes it possible to drastically reduce the stray capacitances because of the presence of the insulating layer 624. The continuous surface of the single crystal silicon layer 622 can be precisely controlled in thickness and doping. Thanks to the very thin layers between source and drain the conduction channel can then actually be completely depleted of carriers (FD) which is very advantageous for the electrical performance of the transistors produced using this technique (FDSOI). However, this has consequences on plasma etching which can damage this layer all the more easily since it is thin or very thin, and thus can compromise the following operations of forming the source and drain electrodes on either side of the gate.

FIG. 6c illustrates these disadvantages. As seen in the previous figures the following operation of wet cleaning intended for removing the passivation layer will also etch, in the source and drain regions 630 on either side of the gate 610, the thin layer of single-crystal silicon which has been damaged or partially etched by the plasma etching operations of the layers forming the gate due to the low selectivity between the different materials of this type of etching. The removing of silicon is then observed in these areas.

FIG. 6d illustrates the next step of conventional production of FDSOI transistors wherein a layer 640 is deposited which is intended for use in the forming of spacers. As shown in FIGS. 6e and 6f the portion of the layer 640 which remains in place on either side of the gate after anisotropic etching thereof effectively forms the spacers 642 between the gate and the source and drain electrodes (not shown).

The forming of spacers 642 has become a crucial step of forming FDSOI type transistors with decananometric sizes. As shown in FIG. 6d, the realization of the spacers is preferably self-aligned with the gate 610 from the deposit of a uniform layer 640, for example made of silicon nitride, which then undergoes a strongly anisotropic plasma etching so as to leave the patterns 642 in place.

However, given the limits and the imperfections of plasma etching discussed above, two main types of defects may be observed after the forming of spacers 642. As already mentioned, a removing or sinking of the surface layer 154 can be observed, as illustrated in FIG. 6e, leaving in place an insufficient thickness of silicon for the following operations in particular for epitaxy intended to form raised source and drain electrodes (not shown).

As shown in FIG. 6f, insufficient etching can also be observed on the contrary as well as the forming of "feet" at the bottom of the spacers 650 that will affect the electrical performances of the FDSOI type transistors by modifying the channel length.

FIGS. 7a to 7i illustrate how the problems entailed in plasma etching, as outlined in FIGS. 2 to 5, more specifically arise when producing MOSFET transistors of the FinFET type, another transistor structure which is progressively used by the microelectronics industry for technological nodes from the 22 nm one. In the FinFET structure, the conduction channel consists of a thin vertical silicon strip, called a "fin". It is surrounded, on three flanks, by the control gate. This makes it possible to produce transistors with improved electrical performances and to reduce leakage currents.

FIGS. 7a to 7i describe the main steps of forming a FinFET. FIGS. 7a, 7b and 7c more particularly illustrate the forming by etching in a layer 710 made of a crystalline semiconductor, usually silicon, three-dimensional patterns, i.e., the "fins", which will form the conduction channel 730 of the transistors. The shape of the channels is defined by a hard mask 720 is transferred by etching into the layer 710. This layer is, for example, the surface layer of single-crystal silicon of an SOI substrate already described and is thus supported by a continuous oxide layer and a substrate (not shown).

FIGS. 7d, 7e and 7f illustrate the forming of the gate of the transistors. As with transistors of the FDSOI type, the gate consists of a stack of layers which are successively deposited onto the patterns which will provide 730 the channels. The thin gate oxide insulating layer 740 and the layer 750 made of a high permittivity (high-k) insulating material covered with a metal gate (metal gate) are then present. The whole is covered by a polycrystalline silicon layer 760 which has been flattened and whereon the hard masks 770 and 780 are deposited and defined by photolithography, which will enable the forming of the gate and the source and drain electrodes of the transistors by etching the stack of the layers above.

FIGS. 7g, 7h and 7i illustrate the following operations, during which the gate layers are etched, which makes it possible to expose, from each pattern 730, the source and drain regions 732 of both flanks gate and to define the length of the channel 734. As with the transistors of the FDSOI type spacers are also needed. These are obtained, after the deposition of a continuous layer 780 typically made of silicon nitride, using a very anisotropic etching of said layer which leaves the vertical patterns 790 only on the flanks of the gate.

Like the FDSOI transistors, the transistors of the FinFET type therefore suffer for their realization of the limits and imperfections of plasma etching. In particular, to achieve this transistor structure, the etching used must have excellent selectivity with respect to the silicon (Si) and the oxide ($SiO_2$) thereof which is difficult to obtain, as seen, with plasma etching. As shown in FIGS. 7g and 7i the integrity of the angles of the etched patterns is affected. As a matter of fact, to obtain good performances from the FinFET transistor, the edges 701 of the <<fins>> should form angles which are as straight as possible, with any rounding of the angles resulting in a reduction in the transistor performances. The same is true for the angle formed by the spacers and the layer supporting these, typically silicon layer. This angle is shown in dashed lines in FIG. 7i.

For the reasons stated above, the current solutions based on plasma etchings do not make it possible to achieve right-angled edges.

This reveals that although plasma etching made it possible to follow the reductions in size of the patterns upon each introduction of a new technological node over the past years, it however raises more and more problems as the size decreases, especially beyond the 22 nm technological node. The implementation of plasma etching for these dimensions introduces an additional degree of complexity to try and overcome the problems described above. More complex etching chemistries than the traditional so-called fluorocarbon one, have been tested which require the introduction of additional gases into the etching chamber. Up to five different gases have been combined to form the etching plasma. The first consequence thereof is an increase in the number of already very numerous parameters, which must be controlled and an optimal adjustment of the etching thus becomes even harder.

Another approach consists in lowering the temperature of the plasma electrons. This can be achieved using at least two methods. One wherein the source of radiofrequency used to create the plasma is not provided continuously but pulsed. Colder plasma is obtained wherein the electron energy is only a few electron volts (eV) or even less than 1 eV. The advantage of colder plasma is that it causes less damage to the etched materials. The other method for obtaining colder plasma consists in using a micrometric radiofrequency source. The electrons then acquire energy in a range from 1 to 2 eV. Such type of plasma is described for example in the following publication:

"Microwave Plasma" Shinichi Tachi et al, J. Vac. Sci. Technol. A 9, 796 (1991). This type of plasma however gives little uniform etching and imposes long etching times.

As for pulsed plasmas reference may be made to the following two publications:

"Pulsed high-density plasma for advanced dry etching processes" Banna et al, J. Vac. Sci. Technol. 30 (4), July/August 2012. This publication sums up the challenges entailed in the development of etching plasma and specifically describes the pulsed plasmas and the advantages thereof.

"Silicon recess minimization during gate patterning using synchronous plasma pulsing," Petit-Etienne et al, J. Vac. Sci. Technol. B, Vol. 30, No. 4, July/August 2012.

It should however be noted that pulsed plasmas do not solve all the problems raised. In particular, if pulsed plasmas do improve the anisotropic nature of etching profiles and selectivity between materials, but at the cost of a complex etching chemistry, they only have a very limited impact on the removing or sinking described by example, in FIG. 6e.

Basically, it should be noted that it is very difficult to control the plasma etching of a material while stopping at an underlying layer without damaging the latter on a few nanometers. As a matter of fact, plasma etching causes the forming and the propagation, when and as the etching progresses, of a reactive layer on a depth which is typically several nanometers. In particular, if the underlying material is single-crystal silicon, which is the case when etching spacers for the FinFET or FDSOI type transistors made of nitride, it is difficult or even impossible to completely etch nitride while stopping at the silicon without damaging it. The thickness of the reactive layer results in that the latter, in practice, always extends in the underlying layer to damage the surface thereof and/or etch it partially. This happens all the more often since more or less important "over-etching" time generally has to be added beyond the time required for etching flat surfaces, to ensure that the inner angles of the patterns to be etched are completely etched. This problem therefore arises more particularly for FinFET type transistors due to the three dimensional structure of these transistors as already discussed above.

This shows that, to etch ever more reduced sizes of patterns the known solutions based on a wet etching or plasma etching have many drawbacks.

It is therefore an object of the invention to describe a new etching method which at least limits some of the drawbacks mentioned above of the known solutions of wet etching or plasma etching.

Other objects, characteristics and advantages of the invention will appear upon examining the following description and appended drawings. It should be understood that other advantages may be incorporated.

SUMMARY OF THE INVENTION

According to a first embodiment, the invention relates to a microelectronic method for etching the material of a layer to be etched, comprising the steps of:
  modifying the layer to be etched from the surface of the layer to be etched and to a depth corresponding to at least a portion of the thickness of the layer to be etched so as to form a modified film, with the modification comprising implanting light ions into the layer to be etched;
  selective removal of the modified film with respect to at least one layer underlying the film and in contact with the latter.

Thus, the film formed by the modification of the initial layer is removed during the step of removing.

It has been found that, by implementing this method, a significantly increased etching selectivity is obtained, thereby enabling to improve the accuracy of etching and the etched thickness control.

Moreover, such improved selectivity is achieved without significant impact on the reactor walls wherein the plasma is produced, thereby reducing the reproducibility problems encountered with the known solutions.

Besides, this method makes it possible to obtain a highly anisotropic etching if the implantation is carried out in a preferred direction.

In one non-limiting embodiment, the implantation is made from plasma comprising light ions. According to an alternative embodiment, the implantation of light ions is performed by implanters.

In another embodiment, the invention relates to a microelectronic method for etching a layer to be etched, comprising the steps of:
  modifying at least a portion of the layer to be etched by implantation in the layer to be etched of etching species, typically light ions, continuously distributed from the surface to a depth corresponding to at least a portion of the thickness of the layer to be etched so as to form a film,
  removing the modified film comprising selective etching of the film with respect to at least one layer underlying the film.

BRIEF DESCRIPTION OF THE FIGURES

The purposes, objects as well as the characteristics and advantages of the invention will better emerge from the detailed description of an embodiment thereof which is illustrated by the following appended drawings wherein.

Figure 1A:
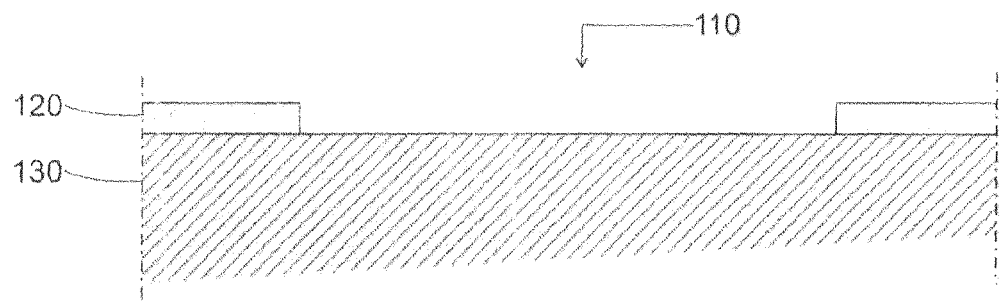
FIGS. 1a to 1c illustrate a standard isotropic etching mode.
Figure 1B:
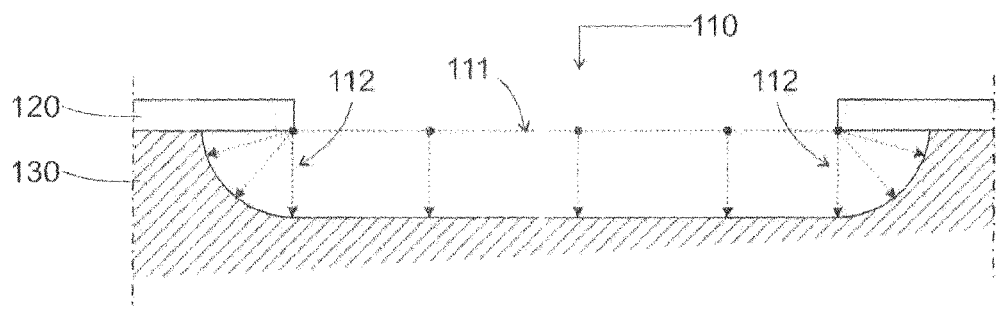
Figure 1C:
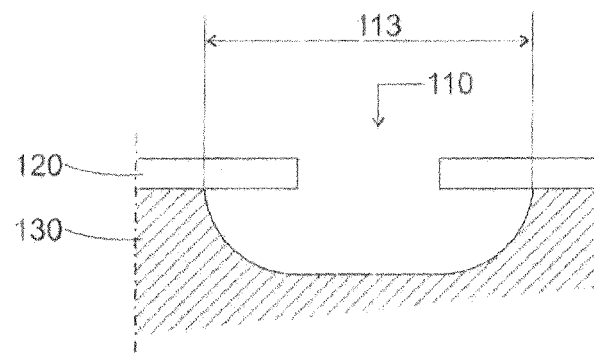
Figure 2A:
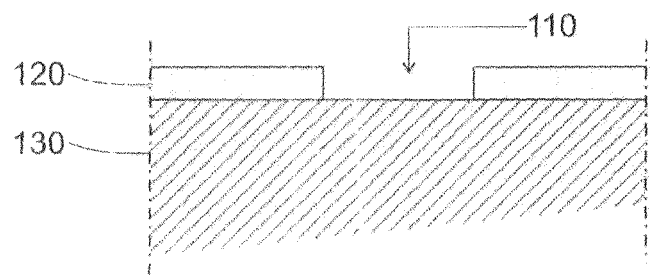
FIGS. 2a to 2d illustrate a standard anisotropic etching mode.
Figure 2B:
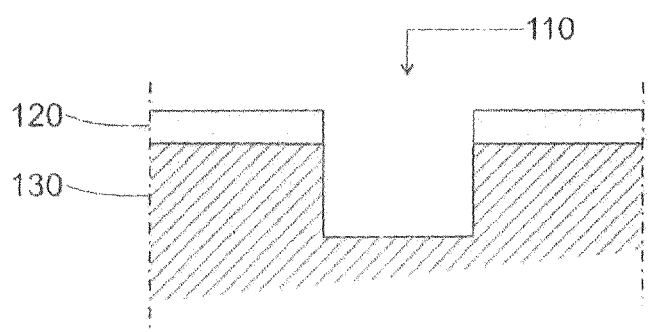
Figure 2C:
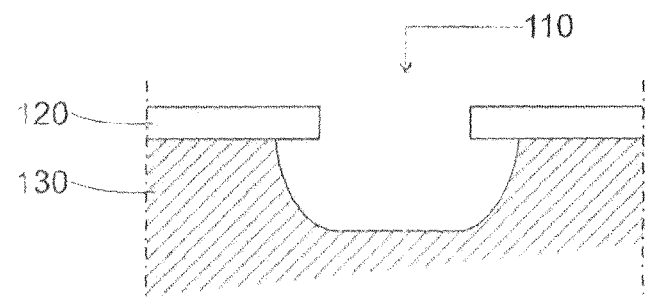
Figure 2D:
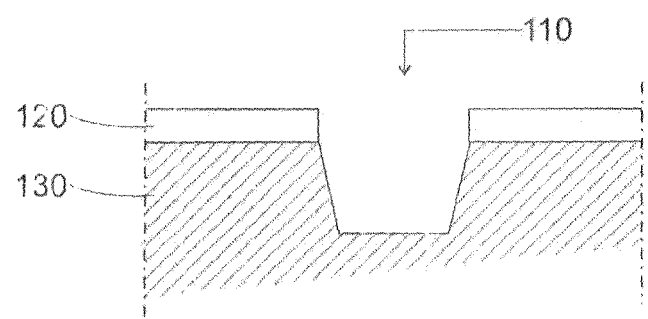
Figure 3:
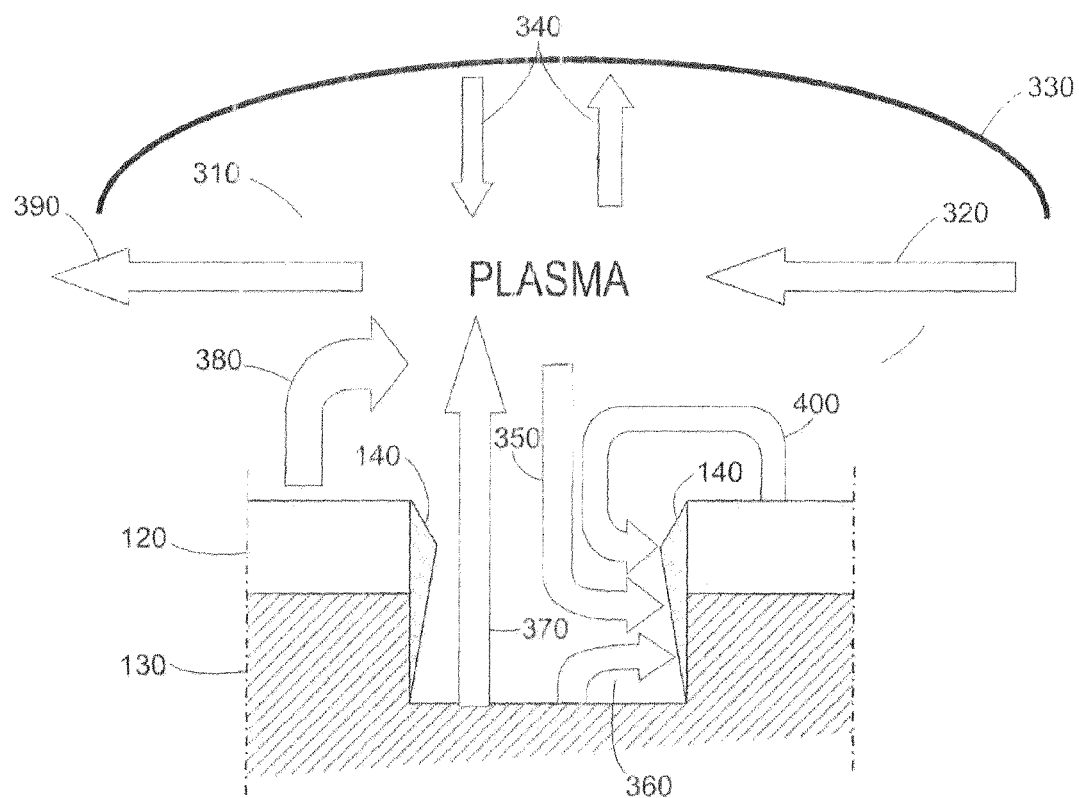
FIG. 3 discusses the operation of conventional etching plasma.
Figure 4A:
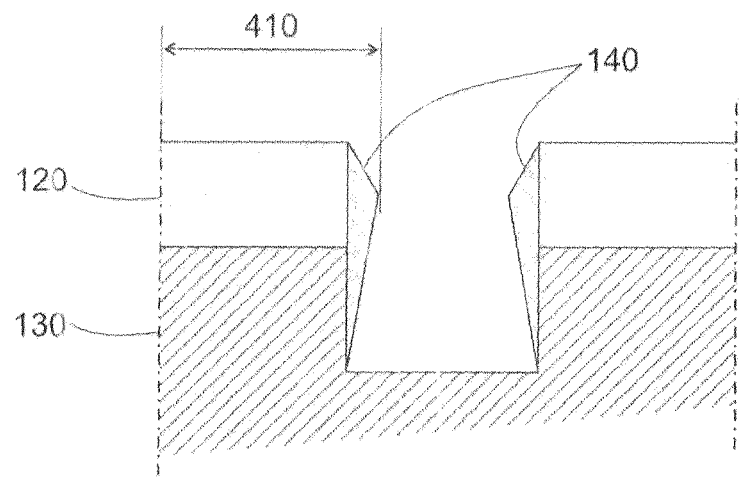
FIGS. 4a and 4b show the forming of a passivation layer during plasma etching and discuss the disadvantages thereof.
Figure 4B:
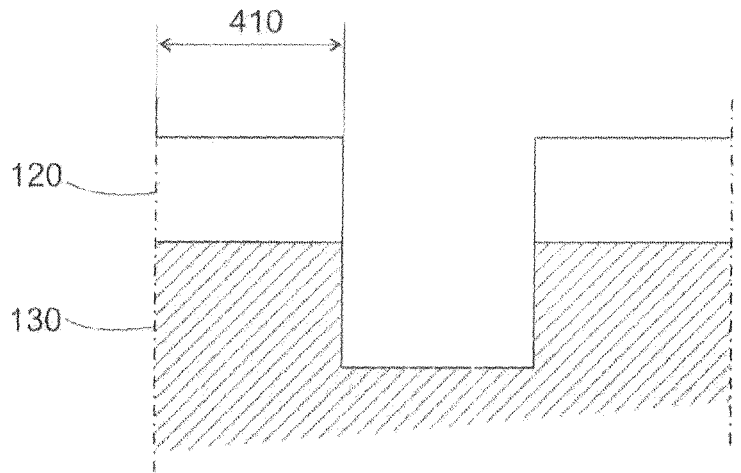
Figure 5A:
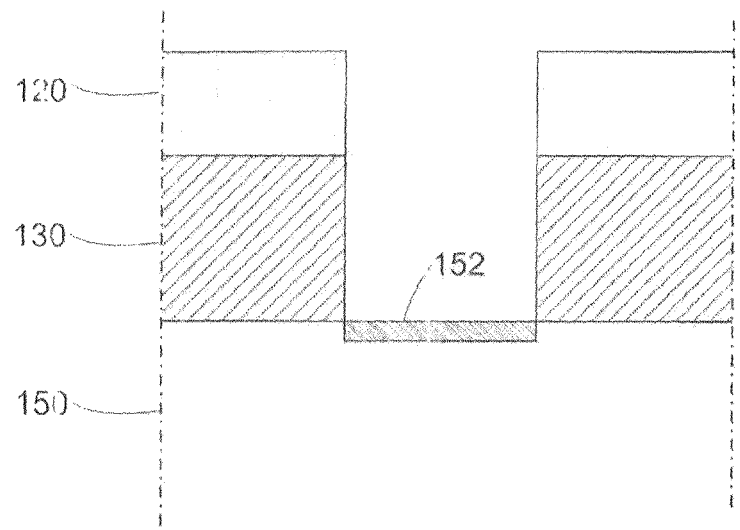
FIGS. 5a and 5b illustrate other drawbacks associated with plasma etching.
Figure 5B:
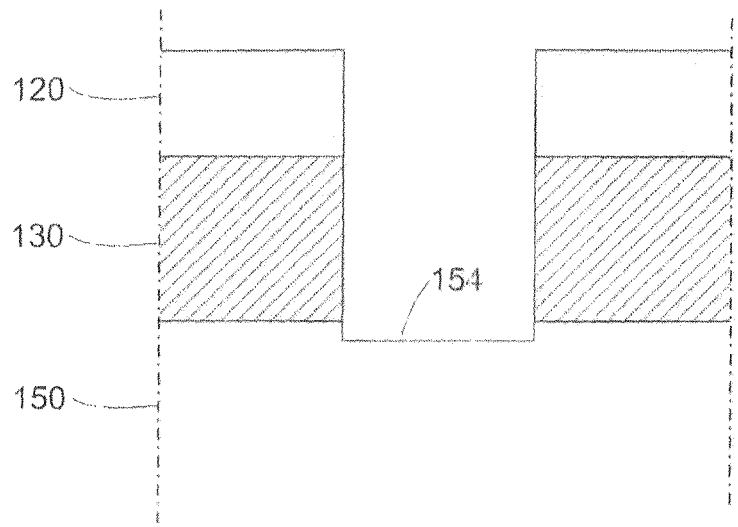

The drawings are given as examples and are not restrictive to the invention. They are schematic illustrations of principle intended to facilitate the understanding of the invention and are not necessarily to scale with practical applications. In particular the relative thicknesses of the various layers and films are not representative of reality.

DETAILED DESCRIPTION OF THE INVENTION

It is stated that in the context of the present invention, the terms "on", "overlies" or "underlying" or their equivalents do not necessarily mean "in contact with". For example, depositing a first layer on a second layer thus does not necessarily mean that the two layers are directly in contact with one another but this means that the first layer at least partially overlaps the second layer in that it may be either directly in contact therewith or separated therefrom by another layer or another element.

In the following description, the thicknesses are usually measured in directions perpendicular to the plane of the underside of the layer to be etched, or a substrate whereon the lower layer is placed. Thus, the thicknesses are usually taken in a vertical direction shown in the Figures. On the contrary, the thickness of a layer covering a side of a pattern is taken along a direction perpendicular to this side.

Before beginning a detailed review of the embodiments of the invention optional characteristics that can possibly be used in combination or alternately are set forth below:

Advantageously, the implantation is performed so that the implanted ions are distributed without interruption from the surface of the layer to be etched and to said depth. Such distribution shows no discontinuity. There are therefore no layers where the implanted species are absent between the surface of the layer to be etched and the maximum depth of implantation. Such distribution may be homogeneous or inhomogeneous. Typically this distribution is decreasing from the surface of the layer to be etched and to said depth.

According to a particularly advantageous embodiment, the implantation is carried out from plasma.

The plasma implantation is advantageous in that it enables a continuous implantation in a volume extending from the surface of the implanted layer.

In addition using plasma enables the implantation at lower depths than the minimum depths obtainable with implanters. Thus, plasma implantation makes it possible to effectively and relatively homogeneously, or at least continuously, implant fine thicknesses which may then be removed by selective etching. Such continuous implantation from the implanted face makes it possible to improve the homogeneity of the modification according to the depth, which results in a constant etching rate of the implanted layer over time. Furthermore, the increase in the selectivity conferred by the implantation with respect to the other layers is effective from the beginning of the etching of the implanted layer. The plasma implantation thus allows a significantly improved control of the etching accuracy.

The plasma implanting typically makes it possible to implant and then remove a thickness extending from the surface of the implanted layer and to a depth ranging from 0 nm to 100 nm. Conventional implanters enable an implantation in a volume between 30 nm and several hundreds of nanometers. On the contrary, conventional implanters do not make it possible to implant the species between the surface of the layer to be implanted and a depth of 30 nm. As part of the development of the present invention, it has been noticed that the implanters then do not enable to obtain a sufficiently constant etching rate of the modified layer from the surface of the latter, which thus leads to a lower etching precision compared to what the invention enables.

Using plasma to change the layer to be removed is therefore particularly advantageous in the context of the invention which aims at removing a thin layer, typically between 1 and 10 nm and more usually between 1 and 30 nm.

The step of modifying executed from plasma changes the layer to be etched continuously from the surface thereof and a thickness between 1 nm and 30 nm and preferably between 1 nm and 10 nm.

According to a particularly preferred embodiment, the implantation and removing of the layer to be etched are performed in the same plasma reactor. A modification of the layer to be removed obtained by plasma implantation thus enables the modification of the layer and the etching in the same chamber which is very advantageous in terms of simplification, time and cost of the process.

Advantageously, such ion implantation does not etch the material causing no re-deposition of the material on the flanks of the patterns or on the walls of the reactor allowing on the one hand, to get a better control of the critical dimensions of the etched patterns and, on the other hand, to gain etching independence with respect to the conditioning of the reactor walls.

Advantageously, obtaining exactly the desired depth of implantation by controlling the ion energy and the dose thereof, does not lead to the forming of a reactive layer as in the standard plasma etching processes thus avoiding the aforementioned drawbacks.

Advantageously, the implantation parameters, in particular the energy imparted to ions, the duration and the implantation dose are provided so that the film can be selectively etched with respect to the at least one layer underlying the film. These parameters are also adjusted so that the film can be selectively etched with respect to the unmodified portion of the layer to be etched.

Advantageously, the ions are chosen so that the film can be selectively etched with respect to the underlying layer.

Advantageously, the ion implantation comprises introducing into the plasma a gas containing one of the following gases: helium (H), hydrogen ($H_2$), argon (Ar) or nitrogen ($N_2$).

Preferably, the implantation of species consists in implanting ions and preferably light ions. "Light ions" means ions from materials the atomic number of which, in the periodic table, is low. In general all the elements that can be implanted into the material to be etched without causing a dislocation of its atomic structure as a result of spraying the latter, and therefore without re-deposition of the etched material on the walls of the reactor or the patterns being etched themselves, are likely to be suitable.

Preferably, the light ions are selected from hydrogen (H2) and helium (He) the atomic numbers of which are respectively 1 and 2. More generally, in the context of the present invention the light ions are taken among the species the atomic numbers of which is less than or equal to 10. One or more of these species may be implanted.

According to one embodiment, the implantation is performed anisotropically, according to at least one direction of implantation substantially perpendicular to the plane wherein the layer to be etched extends, or a substrate whereon the layer to be etched is placed.

According to one embodiment, said layer underlying the film is a portion of the layer to be etched that has not been modified by implantation. Alternately, said layer underlying the film is an additional layer present under the layer to be etched before the step of modifying.

According to one embodiment, the layer to be etched is made of a material based on a semiconductor material comprising: silicon (Si), germanium (Ge), silicon germanium (SiGe). According to one embodiment, the layer to be etched is made of a composite semiconductor material of the III-V and II-VI types obtained by combining, respectively, two or more elements, of columns II and III on the one hand and V and VI on the other hand, of the Periodic Table. According to one embodiment, the layer to be etched is an oxide or a nitride of a semiconductor material selected from the list above.

Alternately, the layer to be etched is a metal oxide or boron-doped carbon (B:C). Alternately, the layer to be etched is a metal or a metal alloy.

According to one embodiment, the modification comprises, before the ion implantation, the oxidation of a portion of the layer to be etched from the surface thereof. The portion of the layer to be etched which is oxidized extends from the surface of the layer to be etched and on a depth of less than or equal to the thickness of said film forming the modified portion of the layer to be etched. This embodiment is advantageous in that it increases the thickness of the oxidized film modified by the implantation of light ions. The removing of the modified layer is thus facilitated without penalizing productivity.

In another embodiment, the modification comprises, after implanting the ions and before removing the film, the oxidation of a portion of the layer to be etched from its surface. Preferably, the portion of the layer to be etched which is oxidized extends from the surface of the layer to be etched and on a depth substantially equal to the thickness of said film. This embodiment is advantageous in that it increases the thickness of the oxidized film modified by ion implantation. The removing of the modified layer is thus facilitated without penalizing productivity. The then oxidized film is then removed more easily than if it had been modified by light ion implantation only.

In yet another embodiment, the modification is performed by plasma comprising oxygen and light ions. Modifying the layer to be etched thus comprises the simultaneous oxidation and implantation of light ions. This embodiment is advantageous in that it increases the thickness of the oxidized film modified by ion implantation. The removing of the modified layer is thus facilitated without penalizing productivity. In particular, the film formed by the layer to be etched thus modified can be removed more easily than if it had been modified by an implantation of light ions only.

Preferably, in such cases, the material of the layer to be etched is a metal or a metal alloy.

According to one embodiment, the modification of the layer to be etched is carried out to a depth corresponding to a portion only of the thickness of the layer to be etched, so that removing the film removes a portion of the thickness of the layer to be etched only. In another embodiment, the layer to be etched is carried out to a depth corresponding to the entire thickness of the layer to be etched, so that removing the film removes the entire layer to be etched. The etching of the film is thus preferably executed on the modified layer forming the film with respect to the positioned layer, before the step of modifying, in contact with the layer to be etched.

According to one embodiment, the step of removing the film comprises at least one of the following steps: a step of wet cleaning, a step of dry cleaning, a step of plasma etching. Preferably, the step of removing the film comprises at least a step of vapor phase etching using a gas reacting with the film to form a volatile reaction product.

Etching Through a Mask

According to a particular embodiment, implantation into the layer to be etched is performed through a mask. The implantation is carried out in a preferred direction that is perpendicular to a plane wherein the mask extends. Preferably, the mask is a hard mask. The mask has openings defining patterns. Preferably the implantation is carried out on the whole plate, i.e. in the mask openings and out of these openings.

According to one embodiment, several cycles are carried out, with each one comprising an implantation into the layer to be etched through the mask and removing the film by selective etching of the film relative to at least the unmodified portion of the layer to be etched. Thus, upon completion of the plurality of cycles, the layer to be etched has been etched on a thickness greater than the implantation depth of each cycle.

Etching Through a Mask without Selectivity Relative to the Mask

According to one embodiment, the step of removing is so performed that the etching etches the film without selectivity relative to the mask, so that, upon removing, a mask thickness substantially equal to the thickness of the film is etched. An initial thickness of mask at least equal to the total depth of the layer to be etched that is desired to be removed is then provided.

Etching Through a Mask with Selectivity Relative to the Mask

In another embodiment, the step of removing is performed so that the etching etches the film rather than the mask so as not to consume the mask during the step of removing or to consume a mask thickness smaller than the thickness of the film during the step of removing.

According to a particular embodiment, the layer to be etched covers patterns having flanks and the implantation of the light ions is performed anisotropically along a direction which is substantially parallel to said flanks. More specifically, the flanks define planes substantially parallel to each other and the privileged direction of the anisotropic implantation is parallel to these planes. Thus, the film formed by the modified layer to be etched substantially extends perpendicular to the flanks. The film does not extend over the entire height of the flanks. Thus, the step of removing leaves a greater thickness of the layer to be etched at the flanks of the patterns than outside the flanks.

Anisotropic Etching, Preservation of Spacers

According to a particular embodiment, the ion implantation is performed anisotropically in a single direction that is substantially parallel to said flanks.

According to a particular embodiment the modification in the layer to be etched is carried out to a depth corresponding to the entire thickness of the layer to be etched taken along a direction perpendicular to the direction of the anisotropic implantation, so that removing the film removes the entire layer to be etched outside the flanks of the patterns and leaves at least a portion of the layer to be etched covering the flanks of the patterns. The method according to the invention thus offers a reliable and very accurate solution to form a layer on the patterns flanks. It thus finds a particularly advantageous application for the forming of spacers placed for example on the flanks of a transistor gate.

According to one embodiment, the patterns are formed in a first material and on top of a layer made of a second material, with the layer to be etched being, before the step of modifying, in contact with the first material at the patterns and in contact with the second material outside the pattern, with the step of implanting and the step of removing being carried out so as to consume the film selectively at the first material and the second material.

Isotropic Etching or Several Anisotropic Etchings

According to a first alternative, the layer to be etched forms patterns and the implantation ion is performed isotropically. Preferably, said implantation is carried out using plasma immersion.

According to another alternative, the ion implantation is anisotropically performed in at least two different directions. To change the direction of implantation a stack of layers, whereon the layer to be etched is arranged, is inclined. The implantation is performed by implanters.

Preferably, the implanting of ions comprises at least another implantation performed anisotropically in at least one direction not parallel to at least some of the patterns flanks so as to implant ions into said flanks and so as to remove, during the step of removing, the layer to be etched which extends outside said flanks of the patterns and at least a portion of the layer to be etched covering said flanks.

According to one embodiment, the ion implantation comprises a first anisotropic implanting executed in a direction substantially perpendicular to a layer whereon the patterns are located, a second implantation carried out according to a direction not parallel to the first flanks of the patterns and so as to implant ions in the first flanks, a third implantation performed in a direction not parallel to the second flanks of the patterns and so as to implant ions in the second side, with the steps of implantation and of removing being executed so as to remove, during the step of removing, the layer to be etched located outside the flanks of the patterns and at least a portion of the layer to be etched covering the first and second flanks.

Several Anisotropic Etchings, Thinning of Spacers

According to a first embodiment, the at least one further implantation is performed so as to modify the layer to be etched covering said flanks to a depth corresponding to a portion only of the thickness of the layer to be etched covering said flanks. Thus, during the step of removing, a portion of the layer to be etched is maintained on said flanks. The method according to the invention thus offers a reliable and very accurate solution to form a layer having a controlled thickness on the flanks of the patterns. It thus finds a particularly advantageous application for forming spacers, for example made of nitride, for example arranged on the flanks of a transistor gate.

Several Anisotropic Etchings, Complete Removing of the Layer to be Etched

In another embodiment, the at least one further implantation is performed so as to modify the layer to be etched covering said flanks to a depth corresponding to the entire thickness of the layer to be etched covering said flanks. Thus, during the step of removing, the whole layer to be etched is removed from said flanks. Said flanks are thus exposed.

The modification of the layer is obtained by implanting light ions from an implanter and the layer to be etched is inclined with respect to the direction of the implantation to implant the ions in the patterns flanks.

Production of Nitride Spacers

According to a particular embodiment, at least one pattern is a gate of a transistor located above a layer made of semiconductor material. The layer to be etched is advantageously a layer of silicon nitride covering the pattern and the layer made of a semiconductor material. The step of modifying is executed so as to implant ions throughout the thickness of the silicon nitride layer located on the periphery of the gate and possibly on a portion of the thickness of the silicon nitride layer located on flanks of the gate. The steps of implanting and of removing the film are conducted so as to selectively etch the film relative to the semiconductor material and the unmodified silicon nitride.

The invention thus allows keeping at least a portion of the silicon nitride on the flanks of the gate. Spacers made of silicon nitride are thus obtained, the thickness of which is precisely controlled, without degrading the underlying layer made of semiconductor material.

Preferably, the step of modifying the silicon nitride layer is preceded by a main step of anisotropic etching comprises a dry etching into methyl fluoride-based (CH3F) plasma.

The semiconductor material is preferably a silicon-based material.

According to a particular embodiment, the step of removing the film consisting of the implanted silicon nitride layer is performed by selective wet etching of said semiconductor material, obtained by using a hydrofluoric acid-(HF) or phosphoric acid-(H3P04) based solution.

According to a particular embodiment, the step of removing the film consisting of the implanted silicon nitride layer is carried out by dry etching into plasma formed in a confined enclosure from nitrogen trifluoride (NF3) and ammonia (NH3).

The dry etching preferably comprises: a step of etching consisting in forming solid salts; a step of sublimating the solid species. This embodiment makes it possible to obtain a very good selectivity of the etching of the modified layer as compared to the unmodified material of the same layer and with respect to the unmodified semiconductor material. In particular, the selectivity of the etching is much greater (typically at least a factor of 10) than the one obtained with an HF solution.

According to a particular embodiment, the method comprises a single step of modifying executed so as to modify the silicon nitride layer throughout the thickness thereof outside the flanks of the gate and not to modify the silicon nitride layer throughout its thickness on the flanks of the gate.

Production of Patterns in a Thin Anti-Reflective Layer

According to a particular embodiment the layer to be etched is covered with at least one masking block, preferably made of photosensitive resin. The masking block and the layer to be etched are covered with a protective layer. The implantation is so carried out as to implant ions at least in areas of the layer to be etched located in the periphery of said masking block, with the ions being so selected that the implanted areas are liable to be selectively etched with respect to the rest of the layer to be etched.

The implantation, in particular the energy thereof, the concentration in ions or the dose used and the duration of the implantation are so provided that said doped areas located at the periphery of said masking block and a non-implanted region of the layer to be etched positioned under the masking block have a boundary positioned overside from or as an extension to the side face(s) of said masking block.

The layer to be etched is preferably an anti-reflective layer.

Figure 8:
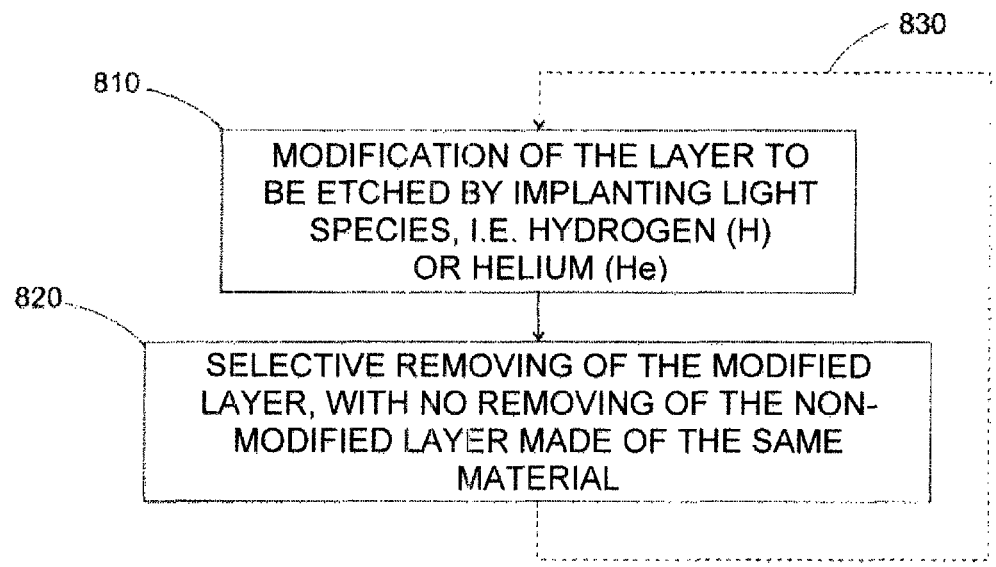
FIG. 8 shows the steps of an exemplary etching method according to the invention.
Figure 9A:
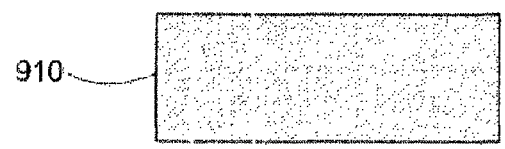
FIGS. 9a to 9c illustrate the result of the steps of etching according to an exemplary implementation method of the invention on the material layers exposed to etching.

FIG. 8 shows the main two stages of the etching process according to the invention. The method of the invention is based on the execution of a first step 810 of modifying the material to be etched. As shown in FIG. 9a, in general, the material to be etched is a layer 910 possibly belonging to a set of layers made of various materials, including semiconductor materials used for making integrated circuits. In most cases, the material to be etched is in the form of patterns to be etched into a continuous layer. The patterns are then defined by a protective mask (not shown) aiming at protecting the areas not to be etched between the patterns. This case is described in FIGS. 20, 21 and 22.

The modification of the material consists in implanting light species or light ions therein. It should be reminded that "light ion" means ions from materials with a low atomic number in the periodic table and in general all the elements that can be implanted into a material to be etched without causing such a dislocation of the atomic structures thereof that the pulverization of the latter would result therefrom.

Typically, the modification in the layer to be etched is based on the implantation of light species such as hydrogen (H) or helium (He).

Figure 9B:
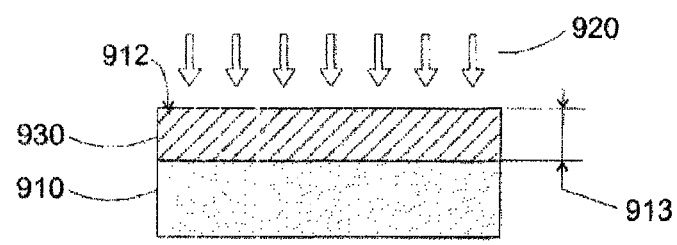

The invention is however not limited to these two species only, as will be explained in greater detail hereunder. As shown in FIG. 9b, the modification is executed to a depth 913 determined by the implantation operation 920 of the species creating a modified layer from the surface 912 exposed to the operation. Such modified layer forms the film bearing reference 930.

As mentioned above, a modification in the layer executed by implantation using plasma is advantageous in that it enables a continuous implantation from the free surface of the layer to be etched and to a low thickness, typically between 0 and 100 nm or even between 0 and 30 nm. It also makes it possible to get an improved selectivity as from the beginning of the etching, and a constant etching rate, which results in an improved precision of etching. It also enables to modify and to remove the layer to be etched in the same enclosure.

Using plasma, to implant the layer to be etched thus makes it possible to effectively remove a very thin layer of nitride, typically between 1 and 10 nm and more usually between 1 and 30 nm.

The second step 820 consists in conducting the removing or selective removing of the film 930 formed by the modified layer while leaving in place the unmodified part of the layer 910 on a residual thickness 914.

Optionally, cycles comprising at least the first and the second steps above 830 are repeated as many times as necessary to completely etch the layer 910, or to reach the desired etching depth, if the latter cannot be obtained in one operation.

Figure 9C:
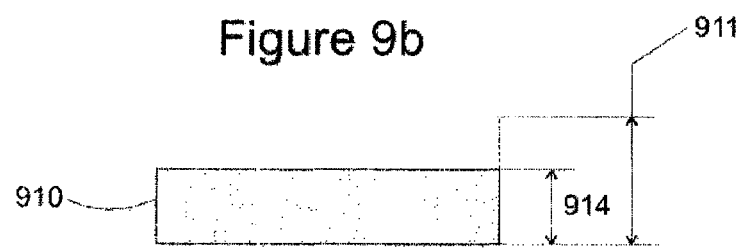

In FIGS. 9a to 9c, the initial thickness of the layer to be etched 910 is noted 911, the thickness of the film 930 formed by modifying the layer to be etched 910 is noted 913 and the remaining thickness of the layer to be etched 910 after the step of removing is noted 914. Thus, upon completion of the implantation and etching cycle(s), we have 911=913+914, with 913 representing the total thickness of the film removed and 914 representing the thickness of the layer remaining after the last cycle. This equation represents the ideal case where only the modified material forming the film 930 is etched, without inadvertent consuming of the unmodified material of the layer 910.

It should be noted here that implanting light species such as hydrogen or helium induces no etching effect in the implanted layer. So during this operation, there is no pulverization of the material to be etched and deposition thereof onto the exposed surfaces, particularly onto the walls of the etching chamber with the disadvantages mentioned in the chapter on the state of the art.

The materials that are liable to be etched using the method of the invention comprise:

All semiconductor materials including silicon (Si), germanium (Ge) and all the composite semiconductors of the III-V and II-VI type which are obtained by respectively combining two or more elements, of columns II and III on the one hand and V and VI on the other hand, in the Periodic Table. These are for example GaAs or GaAs.

All oxides and nitrides of the semiconductor materials above.

All metals and the alloys thereof such as those commonly used by the microelectronics industry including: titanium (Ti) and titanium nitride (TiN), tantalum (Ta) and tantalum nitride (TaN), copper (Cu), platinum (Pt), All materials comprising silicon (Si) as silicon oxynitride (SiON).

All metal oxides and more particularly: hafnium oxide (HF02), lanthanum oxide (LaO), titanium dioxide and monoxide (TiO2 and TiO), zirconium oxide (ZrO2).

boron-doped carbon (B:C).

Thus, the invention is advantageous in that it can be applied to a very large number of materials to be etched.

The step 810 of modifying the layer 910 of material to be etched which requires the implantation of light ions for example hydrogen (H) or helium (He) can be executed from two very different types of equipment which are described briefly below.

In a first type of equipment plasma is formed, which comprises such species. The target to be etched is placed in the plasma and is bombarded by the ions which are produced there. Several options for forming plasma can be considered:

a standard plasma etching chamber wherein the energy applied to the light ions can be controlled, typically H or He is used. Low density plasma of the RIE type, i.e. the acronym for "reactive ion etching" is then created. High density plasma, of the ICP type i.e. the acronym for "inductive coupled plasma" can also be formed in a etcher, an apparatus wherein the radiofrequency field intended to form plasma is produced using an antenna located outside the chamber. A modification of the layer 910 can also be obtained to form the film 930 from high-density plasma obtained in an apparatus of the ECR type, the acronym for "electronic cyclotronic resonance". In this type of apparatus, plasma is produced by superimposing a static magnetic field and a high frequency electromagnetic field at the resonant frequency of the cyclotron or the circular movement of electrons which is produced.

Another option consists in using so-called immersion plasma of the "capacitive coupling" type or CCP, the acronym for "capacitive coupled plasma", wherein a high continuous or pulsed voltage is applied between two electrodes. The target to be implanted is placed on one of the electrodes, generally the cathode, and is therefore negatively biased.

In a second type of equipment, of the implanter type, the ions are directly implanted without the target being placed in plasma. Several options can be considered:

equipment of the IBE type, the acronym for "ion beam etching" is used wherein, conventionally, sufficient energy is communicated to an ion beam for spray etching the bombarded material. Within the scope of the invention, the bombing of small species is thus used to modify the layer 930 without etching it, however. Alternative solutions of such equipment exist, wherein so-called RIBE etching, i.e. a reactive ion etching, is executed which is similar except that reactive ions are integrated into the etching ion beam. In another alternative solution, known as chemically assisted ion beam etching (CAIBE), the reactive species are introduced into the process independently of the ion beam.

a standard implanter of the same type as those used to implant dopant species into a semiconductor material, particularly in silicon, can also be used.

Figure 10A:
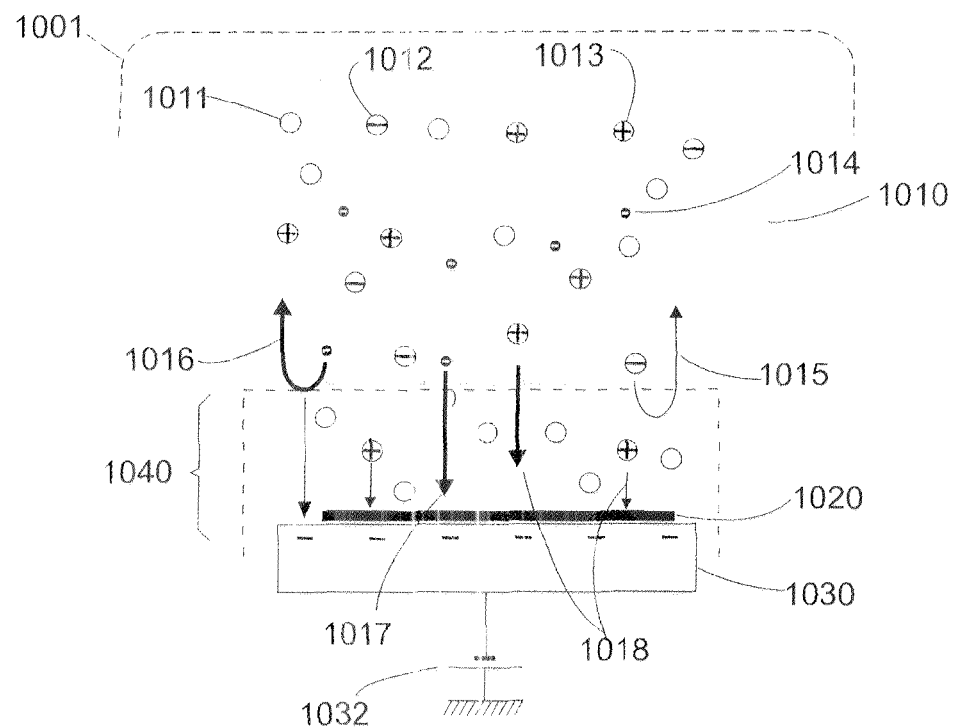
FIGS. 10a and 10b respectively illustrate the conditions of operation of plasma and those of an implanter which can be used for implanting light species according to exemplary embodiments of the invention.

FIG. 10a illustrates the operation of plasma for implanting small species used for the first step 810 of the method according to the invention wherein the surface of the material to be etched 910 is modified to form the film 930.

The operation of such plasma 1010 is well known to the persons skilled in the art. The target to be implanted, typically a wafer or substrate 1020 made from a semiconductor material, typically silicon containing integrated circuits set in the course of the manufacturing process, is placed on the negatively polarized electrode 1032, i.e. the cathode 1030. Because of the confinement in an implantation chamber 1001 and because of the polarization, an electrostatic sheath 1040 is formed which separates the plasma 1010 1020 of the substrate. Plasma comprises neutral species 1011, negatively charged ions 1012, positively charged ions 1013 and electrons 1014. The plasma electrons, lighter than ions, can reach a very high speed. Those which reach sufficient energy go through the sheath 1017 and contribute to the negative charge on the cathode. The others are repelled 1016 as well as the negative ions 1015. A balance is created between the flux of ions and the flux of electrons which participates in the forming and in the maintenance of the electrostatic sheath 1040. The latter repels the negative charges of the plasma but accelerates the positive ions 1018 toward the substrate wherein they are implanted. As the bombardment is substantially perpendicular to the surface of the wafer 1020, the layer to be etched is modified in an intrinsically anisotropic way, and thus will give an anisotropic etching upon completion of the second step of the method of the invention.

Figure 10B:
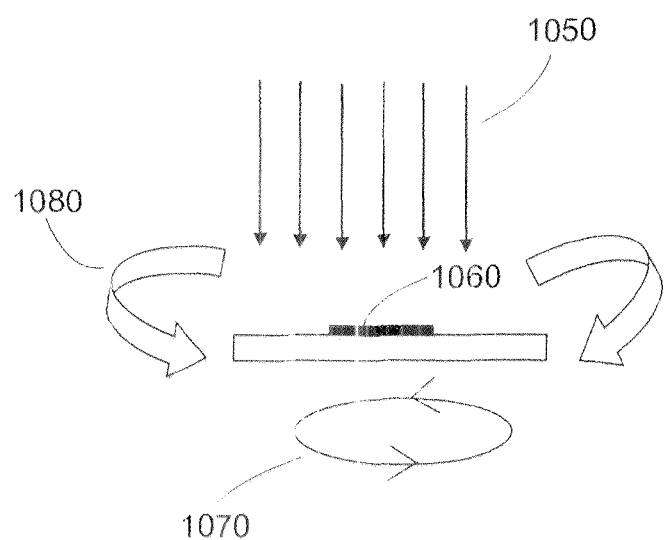

FIG. 10b illustrates the operation of an apparatus of the implanter type wherein a direct implantation of light species is executed during the first step 810 of the etching method of the invention. The implementation superficially modifies the material to be etched 910 to form the film 930 therein. The ion beam 1150 is directed by the equipment onto the target to be etched 1160. It should be noted here that in this type of equipment the target can advantageously be so rotated 1170 and/or inclined 1180 as to expose all the areas to be modified under the best conditions to the ion beam.

Figure 11A:
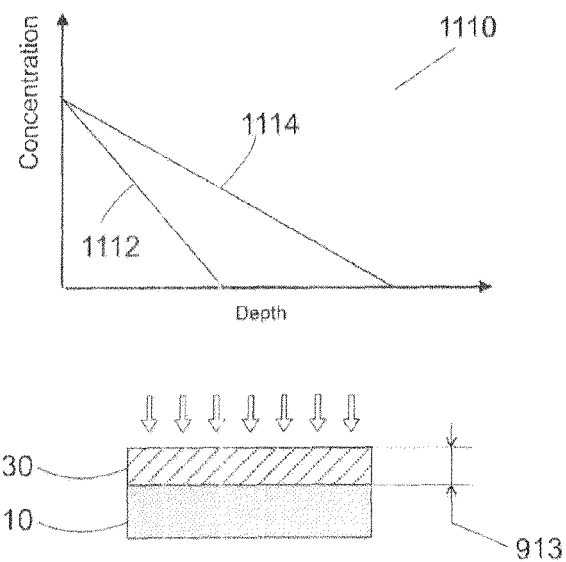
FIGS. 11a to 11b show the modification in the layer to be etched after implantation of light species respectively using, a plasma and an implanter.

FIG. 11a illustrates the concentration profiles 11, 10 of the light species implanted into plasma from the surface. A decreasing concentration gradient is obtained with a high concentration at the surface. The energy acquired by the positive ions typically varies in the range of 200 electron volts (eV) to 2-3 kilo electron volt (keV), depending on the setting conditions of plasma. The line 1112 corresponds to a lower range of implantation energies than the one of the line 1114 which makes it possible to modify the layer to be etched on a greater depth.

As already shown in FIG. 9b a modified layer forming the film 930 by implantation of light species H or He to a depth 913 is thus obtained.

The density of the various types of plasma mentioned above, which can be used to implement the invention, and the energy which may be communicated to the implanted species are summarized in the following table:

|  | Type of plasma | | |
| --- | --- | --- | --- |
|  | CCP | High density | Immersion |
| Density (atoms/cm$^3$): | $10^9$-$10^{10}$ | $10^{11}$-$10^{12}$ | =or >$10^{13}$ |
| Ion energy (eV) | 200-500 | 10-200 | up to $25 \times 10^3$ |

The parameters that apply to any type of etching tool for which the energy imparted to the ions can be controlled to modify the film 930 are summarized below:

| | |
| --- | --- |
| Modified thickness: | from 1 nm to a few dozens nm |
| Chemistry: | Hydrogen (H2) or Helium (He) |
| Source power: | 0-2,000 Watt |
| Bias power (bias): | 20 Watt to 2,000 Watt |
| Pressure: | 5 to 300 milli Torr |
| Temperature: | 10° C. to 200° C. |
| Time: | from a few seconds to a few hundreds of seconds |

The parameters that more specifically apply to immersion plasmas are summarized below:

| | |
| --- | --- |
| Modified thickness: | from 1 nm to a few dozens nm |
| Chemistry: | Hydrogen (H2) or Helium (He) |
| Ion energy! | 0.1 to a few dozens of keV |
| Dose: | From $10^{13}$ atoms/cm$^2$ |
| Pressure: | 5 to 300 milli Torr |
| Temperature: | 10° C. to 350° C. |
| Time: | from a few seconds to a few hundreds of seconds |

The windows of the above tables are large and depend on the specific applications of the method of the invention and in particular the thickness of the layer to be etched.

Figure 11B:
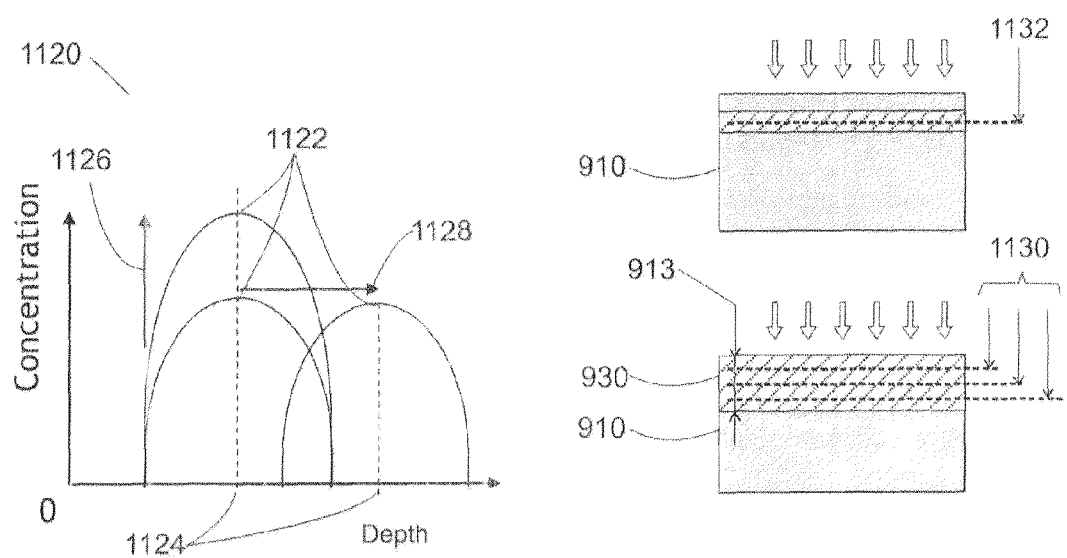

FIG. 11b illustrates the concentration profiles 1120 of the light species implanted using an ion beam in an implanter. Gaussian concentration profiles are obtained, which pass through a maximum 1122 at a given depth 1124. With ion beams having the same energy the concentration increases 1126 with the increasing dose of implanted ions. For the same dose, the mean implantation depth increases 1128 with the increasing energy communicated to the beam ions.

When using an implanter to modify the layer 930 on the whole desired thickness 913, several implantations 1130 must generally be made at different energy levels and therefore at different depths, since only one implantation 1132 is generally not sufficient to modify the layer 930 on the whole thickness from the surface.

The ion source in a standard implanter is typically hydrogen (H2) or helium (He) in gaseous form, with the dose delivered by the beam being greater than or equal to 1011 atoms/cm$^2$ and energy ions being able to reach a few kilo eVs.

When the layer to be etched has been modified during step 810 of the method of the invention, under the conditions described in the preceding figures, the step 820 of removing this modified layer is then executed.

Figure 12:
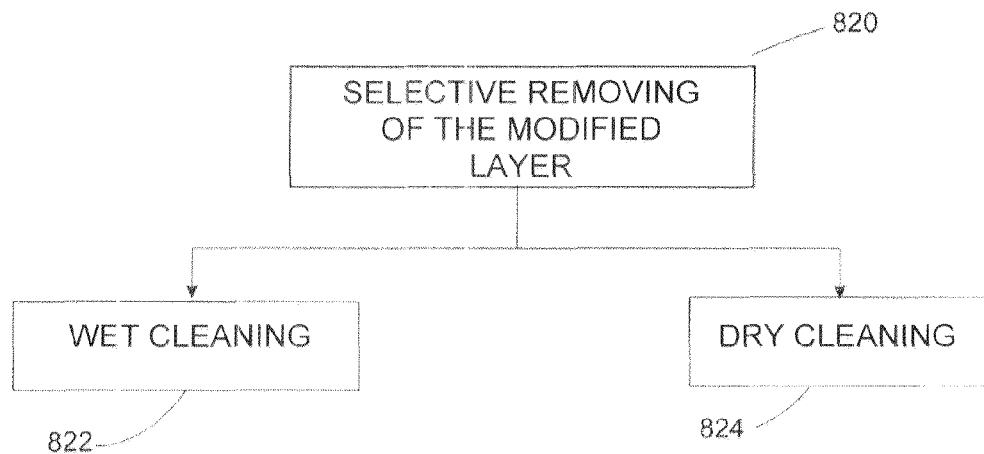
FIG. 12 illustrates different options for removing the modified layer in one embodiment of the invention.

As shown in FIG. 12, the invention unrestrictively describes two possible options:
 wet cleaning 822;
 dry cleaning 824;

Both options can be executed whatever the embodiment used to implant the light ions into the layer to be etched (plasma implantation or implanters).

A first option consists in performing a "wet cleaning" 822, which is executed from acid solutions, particularly based on hydrofluoric acid (HF) or phosphoric acid (H3P04) for silicon. Although the modified material and the unmodified material are both etched by such acid solutions, the modified material is much more sensitive to this type of etching. Highly diluted solutions having a low acid concentration, which very slightly attack the unmodified layer so as to selectively remove the film 930 relative to the material that has not been modified is therefore preferably used. It should be noted here that wet cleaning is not limited to the use of the acid solutions above. Any kind of solution making it possible to consume the modified material may be used. For example a so-called SC1 standard cleaning bath (NH4OH/H2O2/H2O) makes it possible to consume a material such as titanium nitride (TiN). High dilution makes it possible to consume the TiN that has been modified by the hydrogen implantation without consuming, or hardly consuming the unmodified titanium nitride. Hydrogen chloride (HCl) or hydrochloric acid is also used.

In practice, the persons skilled in the art will conduct various dilution tests on the cleaning solution, for example, in a range of values ranging from a very high dilution (1%) to a low dilution (75%) while trying intermediate values such as 10%, 25% and 50%. A comparison of the removing rates between the modified material and the unmodified material is then carried out which makes it possible to select the appropriate dilution rate, i.e. the one which will not etch the unmodified material The other so-called "dry cleaning" option 824, is based on a method described by H. Nishini and al. in a publication entitled "Damage-free selective etching of Si native oxides using NH3/NF3 and SF6/H2O down flow etching" published in the "Journal of Applied Physics" Volume 74 (2) in July 1993.

The principle described above for removing the film 930 from plasma using a dry process works for all the silicon-based materials which have been implanted with H or He ions. This principle applies regardless of the embodiment used for implanting the light ions into the layer to be etched (plasma implantation or implanters).

Figure 13:
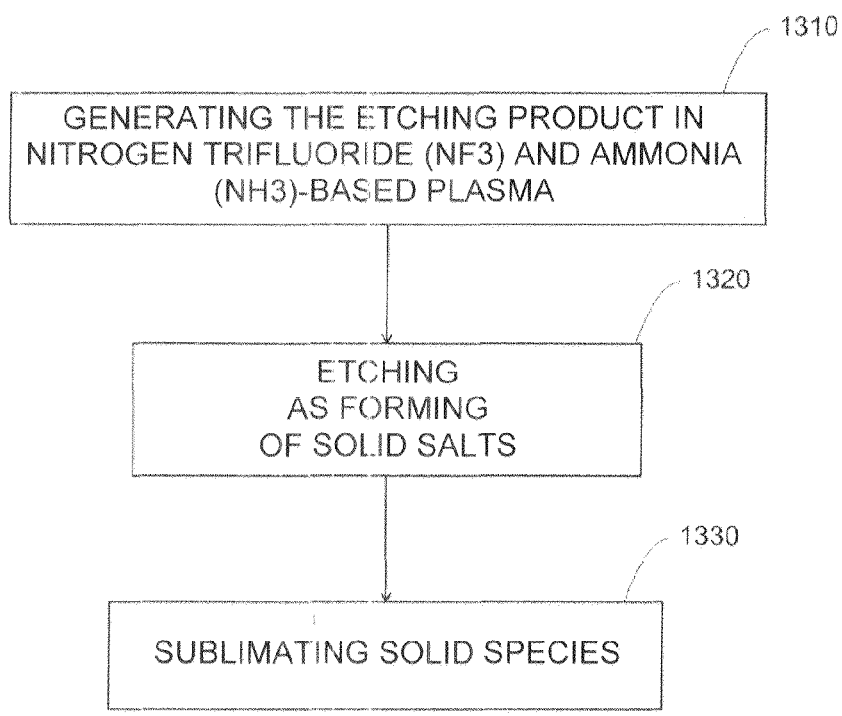
FIG. 13 shows the steps of removing the modified layer by sublimation of solid salts.

The steps of the dry removing process are described in FIG. 13. A first step 1310 consists in generating the plasma etchant according to the following chemical reaction:

NF$_3$+NH$_3$→NH$_4$F+NH$_4$F.HF which makes nitrogen trifluoride (NF$_3$) react with ammonia (NH$_3$).

Etching is performed in a second step 1320, at a temperature of about 30° C. and more generally between 10° C. and 50° C., as salt forming according to the following chemical reaction:

NH$_4$F or NH$_4$F.HF+SiNH→(NH$_4$)2SiF$_6$(solid)+H$_2$ during an operation which lasts from a few seconds to several minutes and which is performed under a pressure ranging from a few milli Torr to a few Torr. Specifically, this operation takes between 20 seconds and 2 minutes and is performed under a pressure ranging from 500 milli Torr to 3 Torr.

The solid species which are formed during this operation are then sublimated 1330 at a temperature above 100° C. for several dozens of seconds depending on the following reaction:

(solid)(NH4)62SIF→SiF4(g)+NH3(g)+HF(g)

The conditions of dry removing the film 930 from plasma are summarized in the table below:

| | |
|---|---|
| Modified thickness: | from 1 nm to a few dozens nm |
| | Forming of salts (step 1320): |
| Chemistry: | based on fluorine and hydrogen with plasma-supplying gas rates ranging from a few dozens to a few hundreds of sccm. The gases used are for instance nitrogen trifluoride (NF$_3$), gaseous hydrogen or dihydrogen (H2) or ammonia (NH$_3$). The above gases are diluted by mixing with other gases such as Argon (Ar) or helium (He), with rates ranging from 100 to 2,000 sccm. The fluorine (F)/hydrogen (H) ratio may be modified to adjust the etching, which is equivalent, in wet chemistry, to modifying the dilution of a hydrofluoric acid-based (HF) solution so that it will not etch the unmodified material, as seen above. |
| Time: | a few seconds to a few minutes. |
| Temperature: | 10° C. to 50° C. |
| Pressure: | a few milli Torr to a few Torr. |
| | Sublimation (step 1330): |
| Heating: | temperatures above 100° C. for a few dozens of seconds. |

This embodiment makes it possible to obtain a very good selectivity of the etching of the modified material of the layer to be etched as compared to the unmodified material of that layer. In particular, the selectivity of the etching is much greater (typically at least a factor of 10) than the one obtained with an HF solution.

It should be noted here that the dry removing of the film 930 is not limited to silicon-based materials. Solid salts of other materials which can be sublimated as described above can be generated by selecting other gases as fluorine and hydrogen.

After describing the steps of the method of the invention, i.e. the modification in the layer to be etched 810 and the removing 820 thereof, exemplary conditions of the method implementation are given hereafter, which are in no way restrictive to the invention. This can be implemented under conditions different from those that have been chosen to illustrate the invention.

The following table gives, for different materials, the thicknesses modified by implanting hydrogen and helium from plasma:

| | Depth of implantation, in nm, for 1 keV, of the ions from plasma: | |
|---|---|---|
| Species: | H2 | He |
| Hafnium oxide (HfO2): | 25 | 15 |
| Titanium nitride (TiN): | 23 | 14 |
| Silicon (Si): | 21 | 13 |
| Silicon nitride (SiN): | 31 | 19 |
| Boron-doped carbon (B:C): | 17 | 10 |
| Copper (Cu): | 11 | 7 |
| Gallium nitride (GaN): | 24 | 14 |

FIGS. 14a to 14e give, for a particular material, i.e. silicon nitride (SiN), the thicknesses of the modified layers obtained according to different conditions for the implementation of the step of implanting light species from plasma.

Figure 14A:
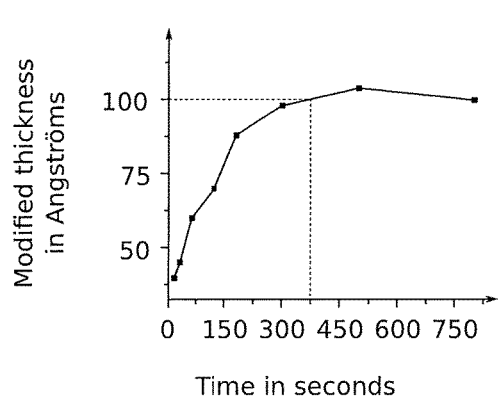
FIGS. 14a to 14e show the evolution of the modified thickness of a material to be etched according to the implantation plasma forming conditions.
Figure 14B:
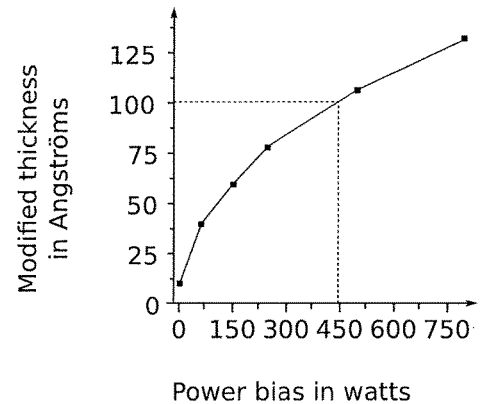
Figure 14C:
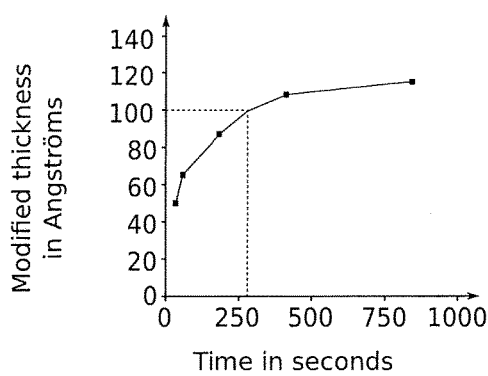
Figure 14D:
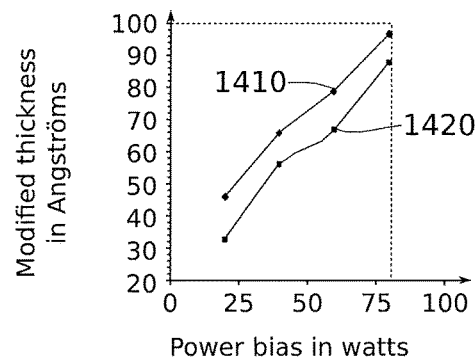

FIGS. 14a and 14b give the thickness modified as a function, respectively, of the time in seconds and of the power of the bias (bias) in watts for a typical ICP etcher and under the following conditions, for FIG. 14a:

H2 flux 200 sccm; source power 500 watts; bias power 150 watts; pressure 10 milli Torr; temperature 50° C.;
and for FIG. 14b:

H2 flux 200 sccm; source power 500 watts; time 60 seconds; pressure 10 milli Torr; temperature 50° C.;

FIGS. 14c and 14d give the thickness modified as a function, respectively, of the time in seconds and of the power of the bias (bias) in watts for a typical CCP etcher and the following conditions, for FIG. 14c:

H2 flux 200 sccm flow; power source zero (0 watt); power of 40 watts polarization;
10 milli Torr pressure; temperature 50° C.;
and for FIG. 14d:

H2 flux 200 sccm; power source zero (0 watt); time 60 seconds; pressure 10 milli Torr; temperature 50° C. In this figure, the curve 1410 corresponds to the implantation of hydrogen, the curve 1420 corresponds to the implantation of helium.

Figure 14E:
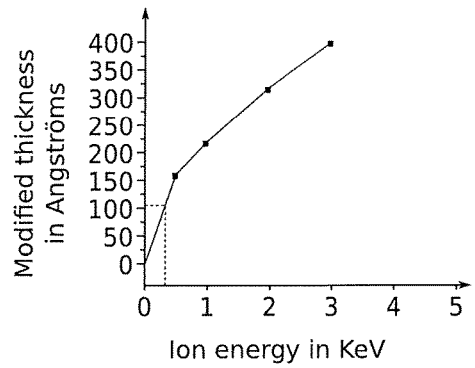

FIG. 14e corresponds to the case of immersion plasma. The implanted thickness is given as a function of the energy imparted to the H2 ions in keV and for an ion flux of 0.1 milliamperes per square centimeter (mA/cm2).

Figure 15A:
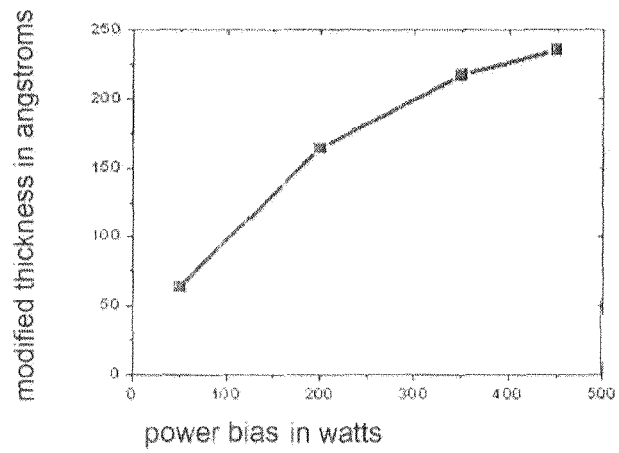
FIGS. 15a to 15c show similar curves for silicon.
Figure 15B:
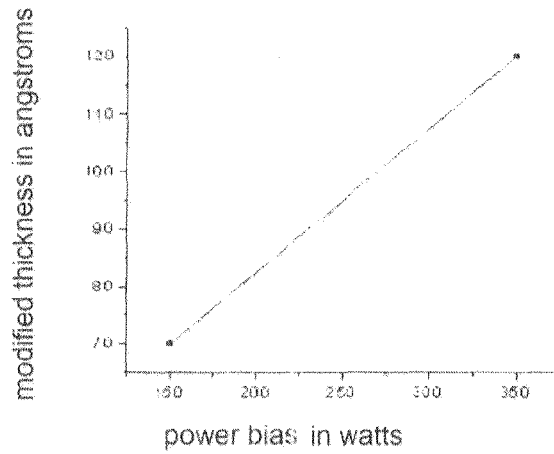
Figure 15C:
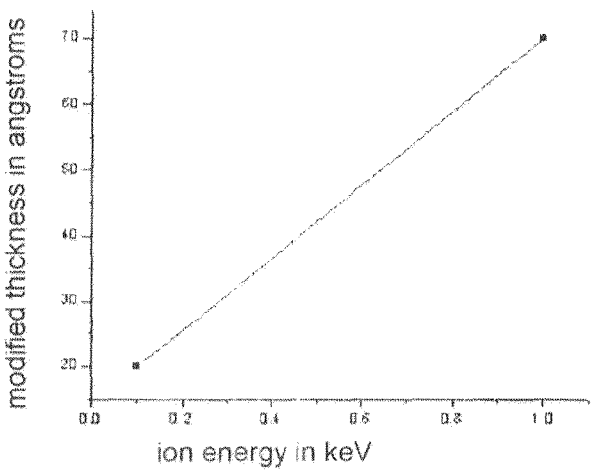

FIGS. 15a, 15b and 15c are similar to the curves of FIGS. 14a to 14e for the base material used in microelectronics i.e., silicon (Si). FIG. 15a gives the implanted thickness of helium (He) ions as a function of the power of bias with a ICP-type etcher. The power source in this case is 150 watts, pressure is 20 milli Torr and the duration of the operation is 60 seconds.

FIG. 15b corresponds to a CCP type plasma etcher and to the implantation of hydrogen (H2) ions for a zero power source (0 watt), with a pressure of 20 milli Torr, at a temperature of 50° C. for 60 seconds.

FIG. 15c corresponds to the case of immersion plasma and to the implantation of hydrogen (H2) ions. The thickness implanted is given as a function of the ion flux in mA/cm2. The energy imparted to the H2 ions in this case is 1 keV.

Curves like those of FIGS. 14a to 14e and 15a to 15c, which respectively relate to silicon nitride (SiN) and silicon (Si) may also be drawn by the persons skilled in the art for any other material. As shown in the figures above, the thickness is mainly determined by the exposure time and/or by the energy imparted to the ions. The behaviour is similar for the other materials commonly used in microelectronics.

To choose the implantation parameters, in order to determine the behaviour of the material to be etched in the type of implanter selected, the persons skilled in the art will preferably execute "full plate" tests, beforehand, in order to draw behaviour curves which can be compared to those of the previous figures. Energy and dose of ions, i.e. the exposure time, to be used to achieve the desired thickness of material to be modified will then be deduced therefrom.

For example, based on the results shown in FIGS. 14a-14e, the conditions may be as follows to modify a thickness of 10 nm of silicon nitride with H2 ions in an ICP type etcher:

H2 flux 200 sccm, source power 500 watts; bias power 450 watts, pressure 20 milli Torr, temperature 50° C. for 60 seconds.

Or:

H2 flux 200 sccm, source power 500 watts; bias power 150 watts, pressure 20 milli Torr, temperature 50° C. for 375 seconds.

In one etcher of the ICP type, the conditions to achieve the same results can be:

H2 flux 200 sccm, bias power 80 watts under a pressure of 20 milli Torr, a temperature of 50° C. for 60 seconds.

Or:

H2 flux 200 sccm, bias power 40 watts under a pressure of 10 milli Torr, a temperature of 50° C. for 250 seconds.

The same results can be obtained in an immersion etcher with an ion flux of 0.1 mA/cm2 and energy communicated to the ions of 0.5 keV.

After giving above exemplary implementations of light species implantation to modify the layer to be etched from plasma, examples of implementations of the removing of the film 930 are given hereunder. These examples are not restrictive to the invention. This can be implemented under conditions different from those that have been chosen to illustrate the invention.

The table below corresponds to the removing of the film 930 made of three different materials obtained using wet cleaning, i.e. according to step 822 described in FIG. 12. The materials had been modified beforehand in an ICP type etching chamber, under the following conditions: H2 Flux 200 sccm; bias power 150 watts; source power 500 watts; pressure 20 milli Torr; temperature 50° C.; duration 60 seconds.

| Material: | Consumed thickness of modified material in nm | | |
|---|---|---|---|
| | after H2 ICP | after 1% HF 30 s | after H2 ICP + 1% HF 30 s |
| Boron-doped carbon (B:C) | 0 | 0 | 14 |
| Hafnium oxide (HfO2): | 0 | 0 | 8 |
| Silicon oxinitride (SiON): | 0 | 0 | 15 |

The table below corresponds to the removing of the film 930 made of four different materials obtained as above using a wet cleaning process. The materials had been previously modified in a CCP type etching chamber, under the following conditions: H2 flux 200 sccm; 'Bias power 50 watts; pressure 20 milli Torr; temperature 50° C.; duration 60 seconds.

| Material: | Consumed thickness of modified material in nm | | |
|---|---|---|---|
| | after H2 CCP | after 1% HF 30 s | after H2 CCP + 1% HF 30 s |
| Silicon nitride (SiN): | 0 | 0 | 13 |
| Silicon oxide (SiO2): | 0 | 3 | 11 |
| SiARC (anti-reflective): | 0 | 20 | >30 |
| Hafnium oxide (HfO2): | 0 | 0 (HF 49%) | 8 |

The following table applies to titanium nitride etching (TiN) in CCP plasma.

| Material: | Consumed thickness in nm of modified material in a CCP type reactor and use of a so-called SC 1 (NH4OH/H2O2/H2O, 1:2:2) cleaning bath | | |
|---|---|---|---|
| | after H2 | after 30 s SC1 | after H2 + 30 s SC1 |
| Titanium nitride (TiN): | 0 | 1 | 15 |

The table below corresponds to the removing of the film 930 made of three different materials obtained as above using a wet cleaning process. The materials had been previously modified in immersion plasma type etching chamber, under the following conditions: ion flux 1 mA/cm2; ion energy 1 keV.

| Material: | Consumed thickness in nm of modified material in immersion plasma | | |
| --- | --- | --- | --- |
| | after H2 CCP only | after 1% HF 30 s only | after H2 + 1% HF 30 s only |
| Silicon nitride (SiN): | 0 | 0 | 22 |
| Silicon (Si): | 0 | 0 | 7 |
| Hafnium oxide (HfO2): | 0 | 0 (HF 49%) | 6 |

The table below relates to titanium nitride (TiN) etching in immersion plasma

| Material: | Consumed thickness in nm of modified material in immersion plasma and use of a so-called SC 1 (NH4OH/H2O2/H2O, 1:2:2) cleaning bath | | |
| --- | --- | --- | --- |
| | after H2 | after 30 s SC1 | after H2 + SC1 |
| Titanium nitride (TiN): | 0 | 2 | 6 |

The following results correspond to the removing of the film 930 obtained using dry cleaning i.e. according to step 824 described in FIG. 12.

For example, to remove a layer comprising 10 nm of silicon nitride (SiN), 10 nm of silicon oxide (SiO$_2$) and 30 nm of SIARC modified in an ICP type etching reactor, under the following conditions: H2 flux 200 sccm; source power 500 watts; bias power 450 watts; duration 60 seconds; the conditions of a dry cleaning can be those in the table below.

| step 1320 of forming solid salts: | NF3 flux 50 sccm; NH3 300 sccm; He 1,000 sccm; temperature 30° C.; duration 45 seconds. |
| --- | --- |
| step 1330 of sublimating: | Heating to 180° C. for 60 seconds |

To remove 7 nm of modified silicon in a CCP type etching reactor under the following conditions: H2 flux 200 sccm; power source zero (0 watt); bias power 150 watts; duration 60 seconds; the conditions of a dry cleaning can be those in the table below.

| step 1320 of forming solid salts: | NF3 flux 150 sccm; NH3 250 sccm; He 1,000 sccm; temperature 50° C.; duration 120 seconds. |
| --- | --- |
| step 1330 of sublimating: | Heating to 100° C. for 120 seconds |

Using plasma as described in FIG. 10 makes it possible to use different gases. The invention can be extended to any hydrogen-based, for example ammonia-based (NH3) plasma and in general to any gaseous hydrogen- or helium-based compound, for example, dihydrogen (H2) combined with nitrogen (N2/H2) with oxygen O2/H2 or ammonia combined with nitrogen (N2/NH3).

Figure 16A:
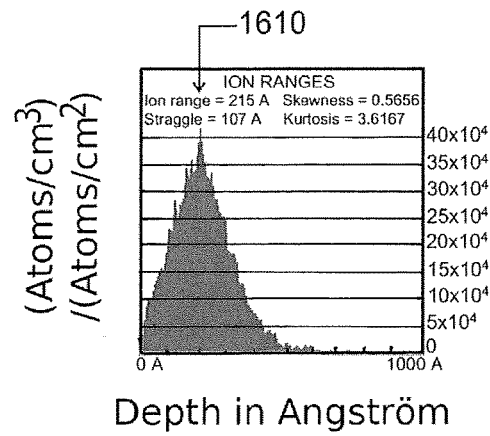
FIGS. 16a to 16c relate to the use of light species other than hydrogen and helium.
Figure 16B:
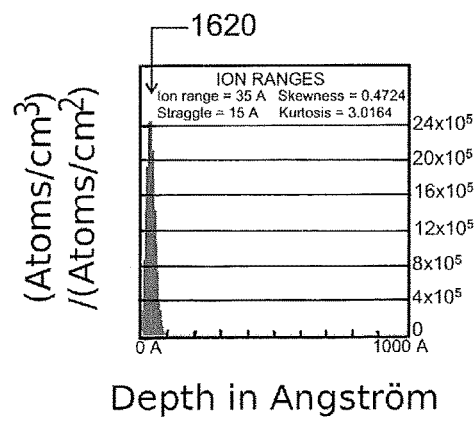
Figure 16C:
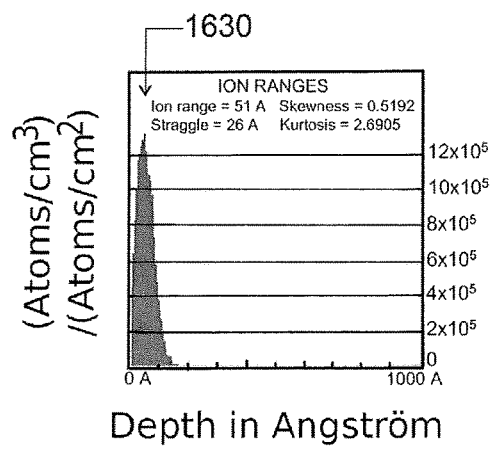

The description above has focused on the implementation of hydrogen (H) and helium (He) light species, which have proven to be best suited to modify the materials to be etched. However, the invention is not limited to these species. Other reactive species such as argon (Ar) and nitrogen (N2) may also, for example, be used. However, as shown in FIGS. 16*a* to 16*c*, it can be seen that the implantation depth of these ions is smaller. The above figures compare the depth of the ion penetration into silicon, which have been conferred energy of 1 keV. FIGS. 16*a*, 16*b* and 16*c* respectively show the penetrations obtained with hydrogen ions, for comparison, and with argon and nitrogen ions. The mean penetrations observed, 1610, 1620 and 1630 are respectively 20, 3 and 5 nm. It can also be noted that these species are less effective for modifying the layer of material to be etched. In addition, they are prone to re-deposition particularly onto the walls of the etching chamber with the potential disadvantages mentioned in the section on the state of the art.

Figure 17:
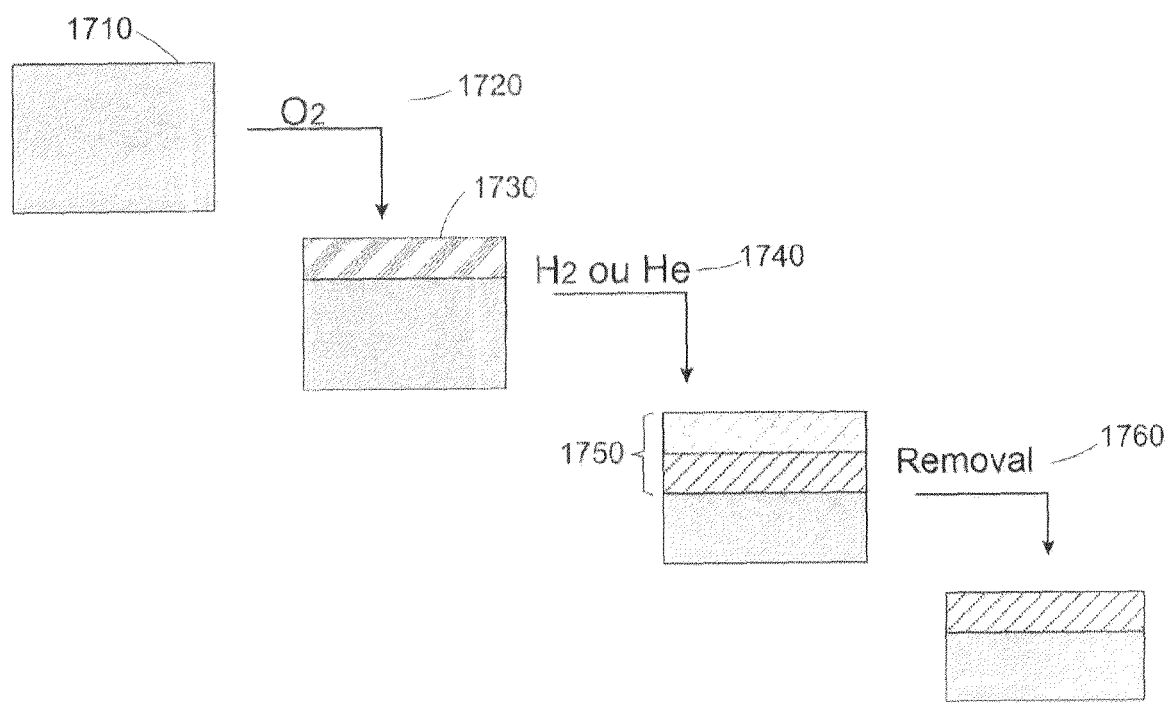
FIG. 17 relates to oxidation metal etching.

FIG. 17 illustrates a first way of applying the method of the invention for etching metals. In the metal to be etched 1710, a surface oxidation 1730 of the metal to be etched is performed first of all in this case from an oxygen-based plasma (02) 1720. H or He 1740 light species are then implanted to a depth 1750 which possibly extends beyond the oxidized layer 1730 of the metal 1710. The oxidized and implanted layer can then be removed 1760. It can be noted that the layer first oxidized and then modified by implanting light species can be removed much more easily using wet cleaning than the layer which was only implanted by the light ions.

Figure 19A:
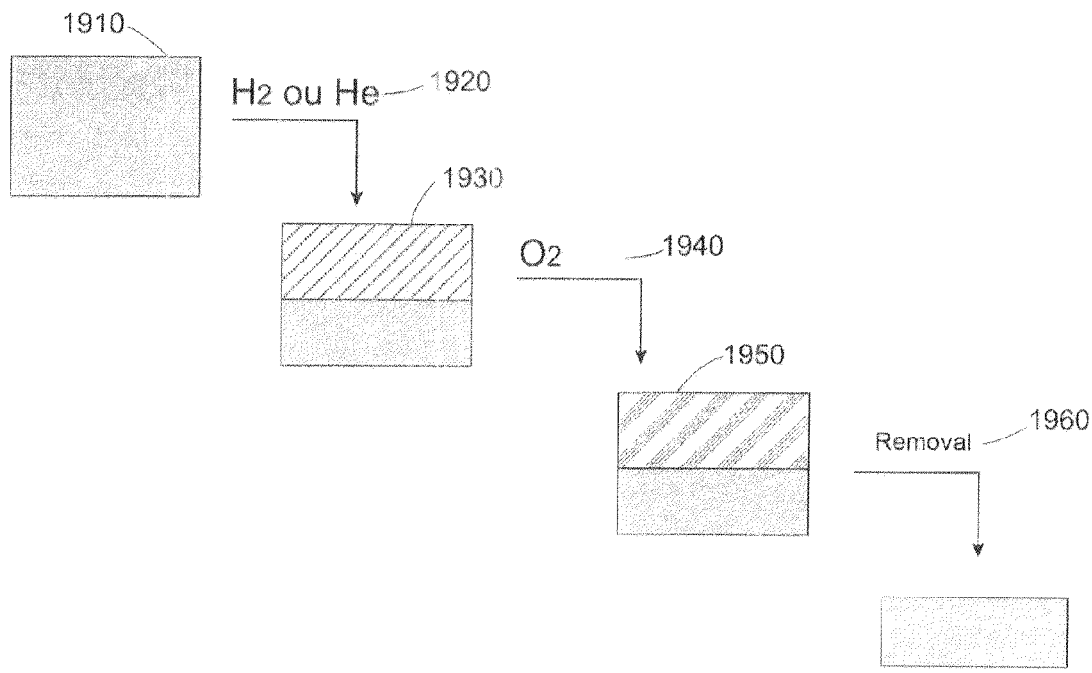
FIGS. 19a and 19b illustrate, for metals, the improvement in efficiency provided by oxidation during the removing of a modified layer.

It should be noted that the embodiments illustrated in FIGS. 17 and 19*a* apply both to the implantations executed by implanters and to plasma, although the latter makes it possible to simplify the process when implantation and oxidation are performed in the same reactor.

Figure 18A:
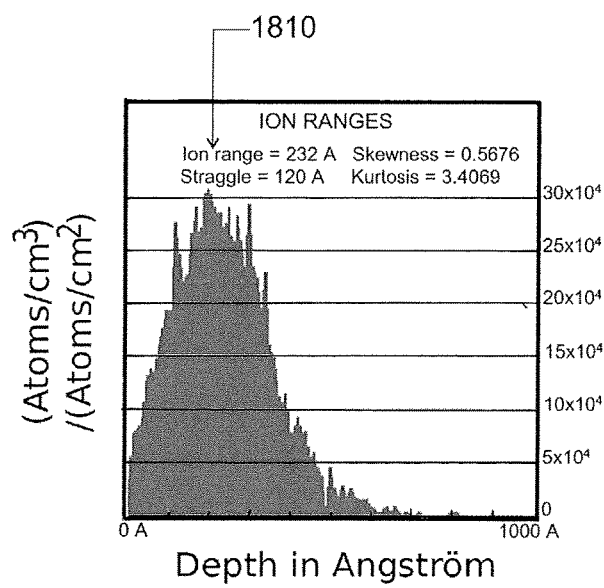
FIGS. 18a and 18b compare the ion implantation depth in titanium nitride (TiN).
Figure 18B:
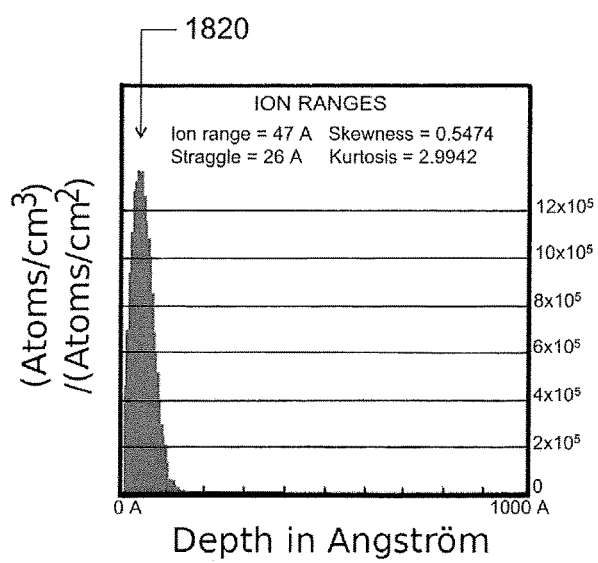
Figure 19B:
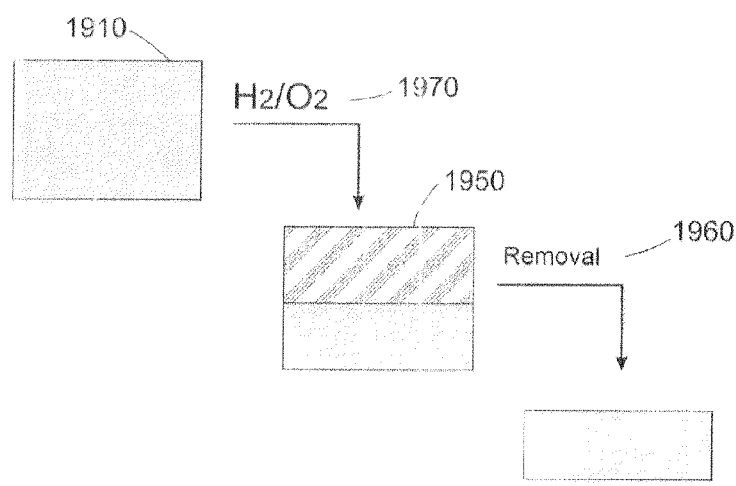

FIGS. 18*a* and 18*b* compare the depth of the ion implantations which have been conferred energy of 1 keV, in titanium nitride (TiN). FIG. 18*a* shows the depths obtained with hydrogen (H) ions. An average penetration 1810 of 23 nm can be noted. FIG. 18*b* shows the depths obtained with oxygen (O) ions wherein an average penetration 1820 of only 5 nm can be noted. FIGS. 19*a* and 19*b* illustrate, for metals, the improved efficiency provided upon removing the film 930 by oxidation.

FIG. 19*a* shows another approach wherein an implantation 1920 of H or He light species is first executed in the metal etching 1910 to, as described above, obtain a modified layer forming a film 1930. An oxidation 1950 of this film 1930 then follows, in oxygen-based (O2) plasma 1940. It can also be noted here that the thus modified and oxidized layer can be more easily removed 1960 using a wet cleaning process than if it is implemented with only H or He light species.

In addition, and advantageously, modifying the layer by implanting H or He ions prior to the oxidation makes it possible to increase the thickness of the oxidized layer as compared to a single oxidation.

FIG. 19*b* shows still another way wherein a H2 ions implantation and a simultaneous oxidation 1970 are carried out in order to modify the layer 1910 to obtain the film 1950 in a single operation in plasma containing both species. Such plasma with O2/light ions-based chemistry makes it possible to reduce the number of steps in the process and to remove the modified film more easily.

An exemplary etching of a metal layer with oxidation is as follows. To remove a thickness of 10 nm in a titanium nitride (TiN) layer:

H2 ion are first implanted from plasma formed in a PCB type etcher under the following conditions: H2 flux 500 sccm; bias power 350 watts; pressure 20 milli Torr; temperature 50° C.; duration 2 minutes.

oxygen is then introduced under the following conditions: H2 flux, 200 sccm; bias power 350 watts; pressure 20 milli Torr; temperature 50° C.; duration 2 minutes.

The film 930 is then removed using a wet cleaning process using a hydrofluoric acid-based buffered etching solution, so-called BOE, the acronym for "buffered oxide etch", diluted to 49% for 1 minute.

FIGS. 20a to 20d describe the method of the invention when it is applied to the anisotropic etching of patterns defined by a mask.

Figure 20A:
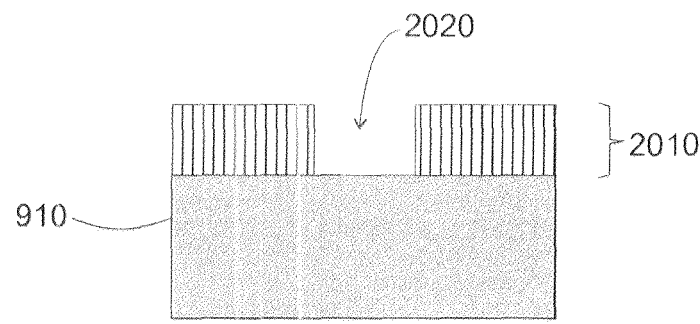
FIGS. 20a-20d disclose an exemplary method according to the invention when applied to the anisotropic etching of patterns defined by a hard mask.

FIG. 20a shows, like FIG. 9, the layer of the material of the layer to be etched 910. However, etching will not cover the entire extent of the layer this time. Patterns 2020 will be defined therein using a mask, typically a hard mask 2010.

Figure 20B:
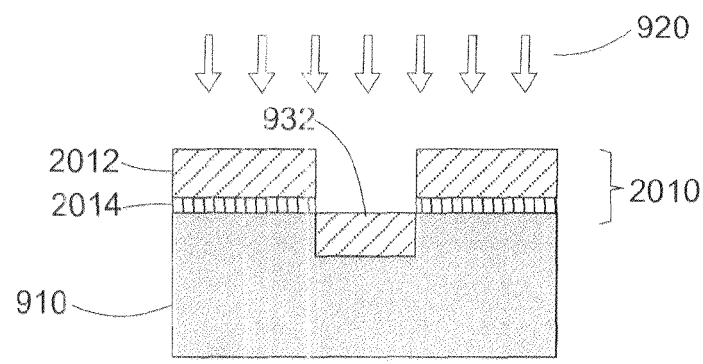

FIG. 20b is similar to FIG. 9b and shows the result of the implantation of H or He ions 920. Since it is protected by the hard mask, the layer 910 will be modified right above the patterns 2020 defined in the hard mask only. The modified portion is referenced 932. As the hard mask is exposed to the ion bombardment, a part 2012 of the layer of the material forming the latter is modified too. The material forming the mask and the thickness thereof are so selected that an unmodified residual layer 2014 remains.

Figures 20C, 20D:
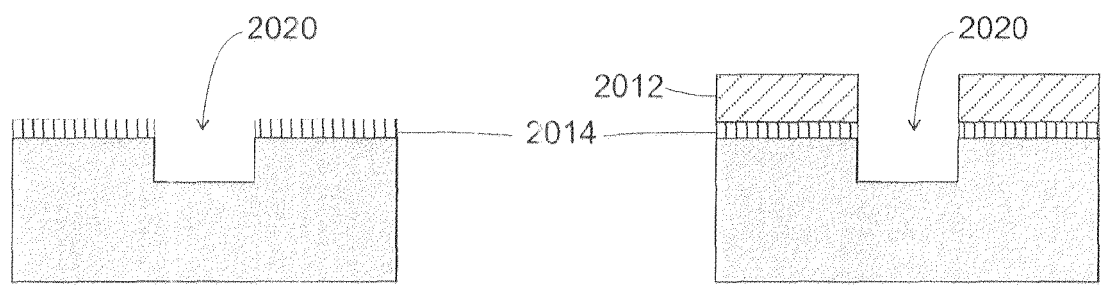

After removing the modified layer forming the film 932, the pattern 2020 is transferred into the material of the layer to be etched 910. Two options are then possible, depending on the type of etching of the modified layer which has been retained. FIG. 20c shows the case where the chosen etching is selective with respect to the non-modified material of the layer 910 only. In this case, the modified part of the hard mask is etched too and the unmodified residual layer 2014 thereof remains in place only.

On the contrary, and as shown in FIG. 20d, if a selective etching, with respect to the material of the layer 910 and that of the hard mask 2010 has been chosen, then the modified hard mask 2012 remains in place.

FIGS. 21a-21f disclose the method of the invention when applied to the anisotropic etching of patterns in the case where the etching is not selective with respect to the hard mask and several cycles of modification of the layer to be etched and removing thereof are required to be able to reach the desired etching depth of the layer 910.

Figure 21A:
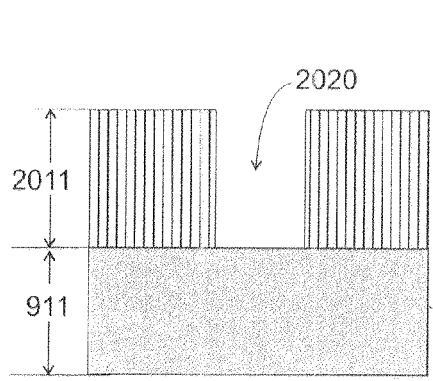
FIGS. 21a to 21f disclose an exemplary method for example according to the invention when applied to the anisotropic etching of patterns in the case where etching is not selective with respect to the hard mask.

As shown in FIG. 21a the hard mask must then have a thickness 201 greater than the total thickness of the layer to be etched (or the thickness desired to be etched into this layer).

Figure 21B:
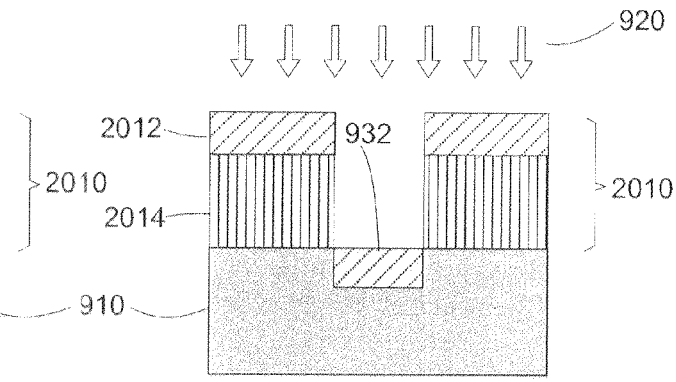

As above, a first step of implanting 920 H or He light species is then carried out which modifies the areas 932 of the layer 910 and the hard mask layer 2012. The result is shown in FIG. 21b.

Figure 21C:
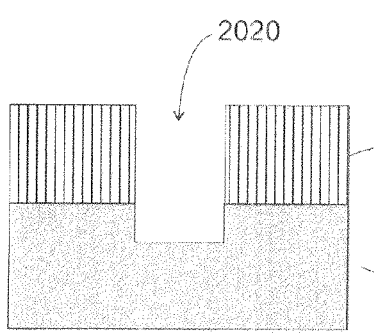

As shown in FIG. 21c, the etching of the modified area 932, which is non-selective with respect to the material of the hard mask, transfers the pattern 2020 into the layer 910 and also removes the hard mask layer 2012. As the latter is thick, sufficient thickness remains 2014 which makes it possible to repeat the above operations in order to continue etching the pattern 2020 into the layer 910.

Figure 21D:
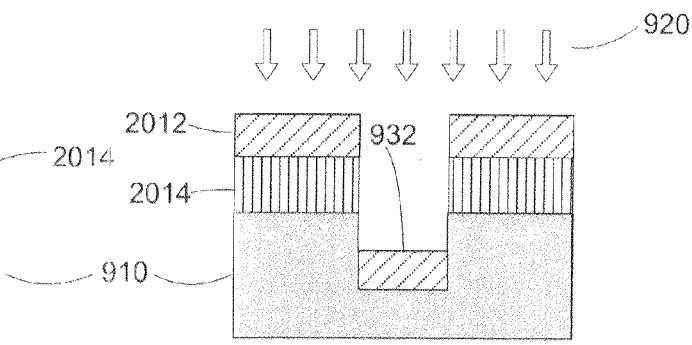
Figure 21E:
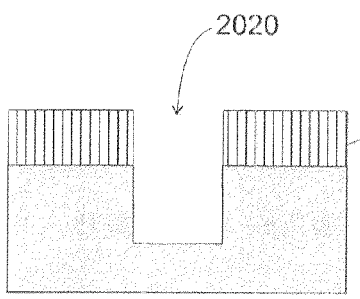
Figure 21F:
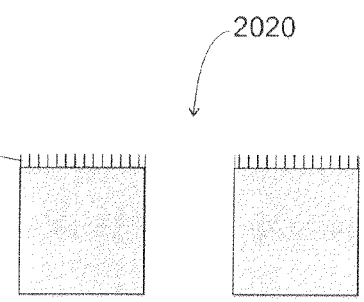

The result of a second step of modifying by implantation 920 is illustrated in FIG. 21d. The hard mask and the layer to be etched are modified as above. FIG. 21e shows the result after removing the modified layers. The hard mask is consumed after each etching. However, its thickness has been so selected that the above cycle of steps can be repeated as many times as necessary to go through the layer 910 as shown in FIG. 21f or reach the desired etching depth. Typically, when the etching of the layer 910 is not selective with respect to the mask 2010, the initial thickness 2011 of the mask 2010 is then so chosen as to be greater than or equal to the total depth which is desired to be etched into the layer 910.

Figure 22A:
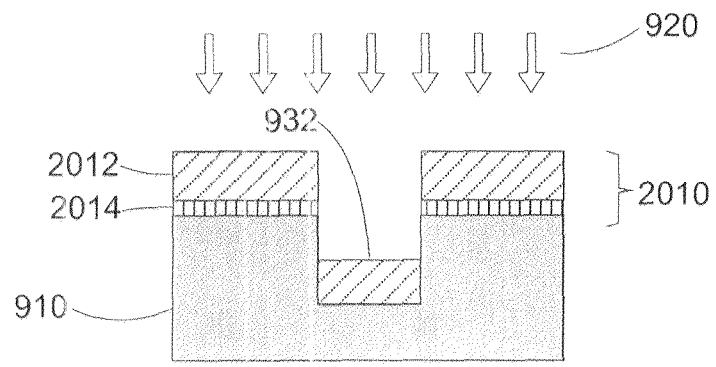
FIGS. 22a-22c complement FIGS. 20a to 20d and show the case where the hard mask is not consumed during the operation removing the modified layers.
Figure 22B:
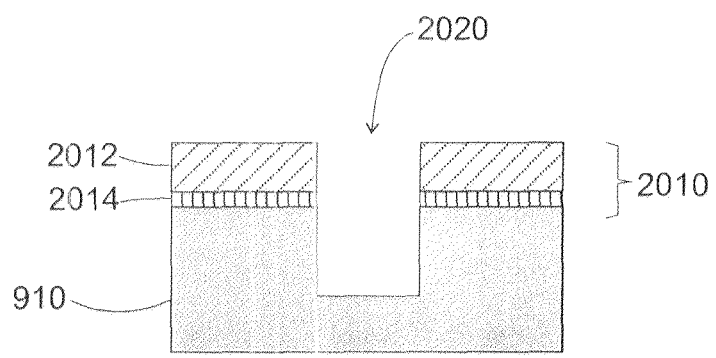
Figure 22C:
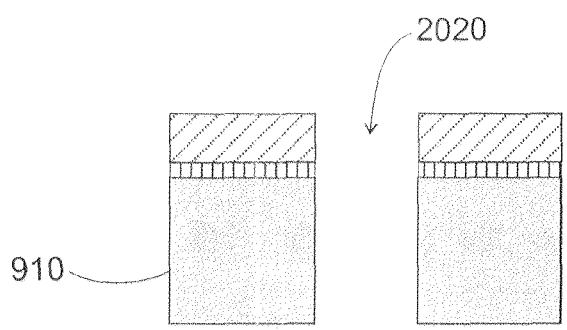

FIGS. 22a-22c complete FIGS. 20a, 20b and 20d. They illustrate the case where the hard mask 2010 is not consumed during the removing of the modified layers, i.e. in the case where the etching is selective with respect to the unmodified portion of the layer 910 and is also selective with respect to the modified layer 2012 of the hard mask. FIGS. 22a to 22c show the repeated cycles of modifying and removing the modified layer until the pattern to be etched 2020 goes through the layer 910, as shown in FIG. 22c or reaches the desired etching depth as shown in FIG. 22b. FIGS. 22a to 22c are similar to FIGS. 21d to 21f except that, in this case, the hard mask is not consumed but remains in place during every cycle and the thickness thereof needs not be substantial as shown in FIG. 21a.

Figure 23A:
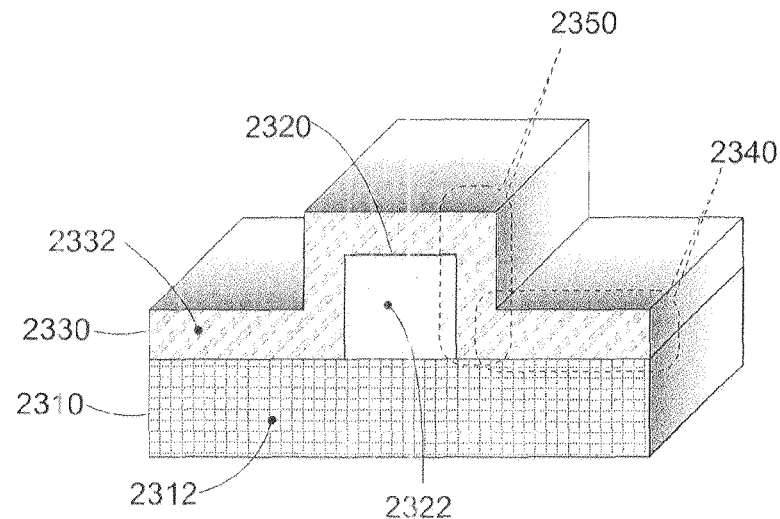
FIGS. 23a to 23c illustrate the general concept of isotropic and anisotropic etching which have to be implemented in microelectronics.
Figure 23B:
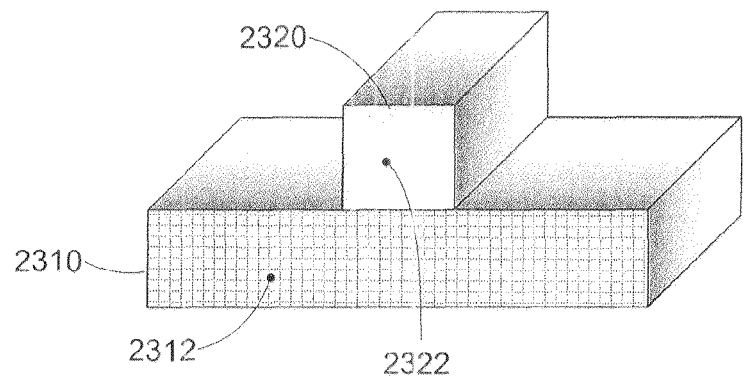
Figure 23C:
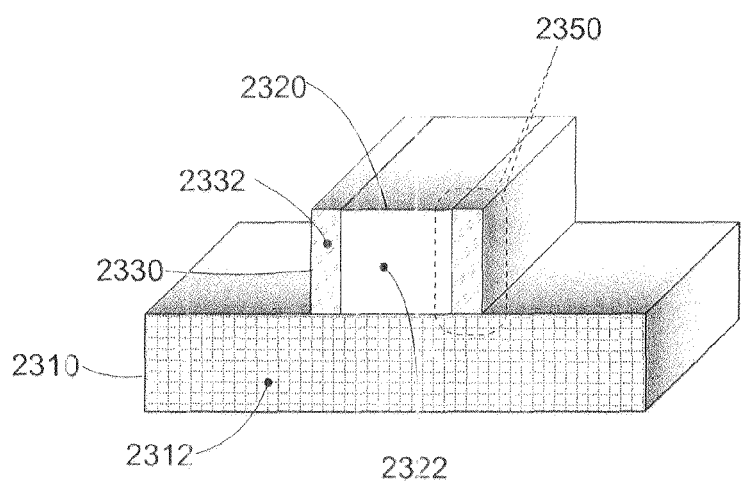

FIGS. 23a, 23b and 23c illustrate the general concept of isotropic and anisotropic etching which have to be implemented in microelectronics at different stages of manufacture of the devices produced by this industry.

FIG. 23a shows the common case of layers and patterns made of different materials and having a relief which have to be etched. In the representative example shown in FIG. 23a three materials are present as a substantially flat layer 2310 of a first material 2312, a second material 2322 wherein 2320 patterns have been defined during the preceding manufacturing operations, and a layer 2330 of a third material 2332 covering the whole assembly. The layer 2330 has different levels and horizontal portions 2340 in FIG. 23a, i.e. parallel to the substantially flat layer 2310, and vertical portions 2350, i.e. perpendicular to the layer 2310 on the flanks 2320 of the protruding patterns can thus be defined in this layer.

FIG. 23b illustrates the case of an isotropic etching of the layer 2330 which is selective with respect to the materials of the layer 2310 and the patterns 2320. Etching is executed evenly whatever the orientation of the etched surfaces. In particular etching is identical for vertical surfaces 2350 and for horizontal surfaces 2340.

FIG. 23c shows the result of anisotropic etching which preferentially etches the surfaces perpendicular to the plane wherein the layer 2312 extends i.e., the horizontal surfaces. This type of etching leaves the etched layer 2330, at least partially, on the vertical surfaces 2350, i.e. on the flanks of the patterns 2320.

Figure 6A:
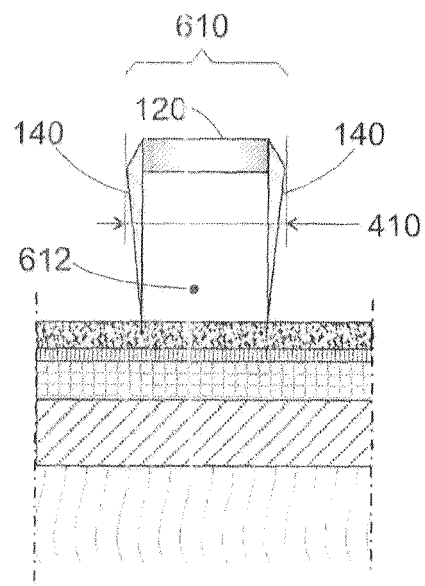
FIGS. 6a-6f show the steps of forming a MOSFET transistor of the FDSOI type.
Figure 6B:
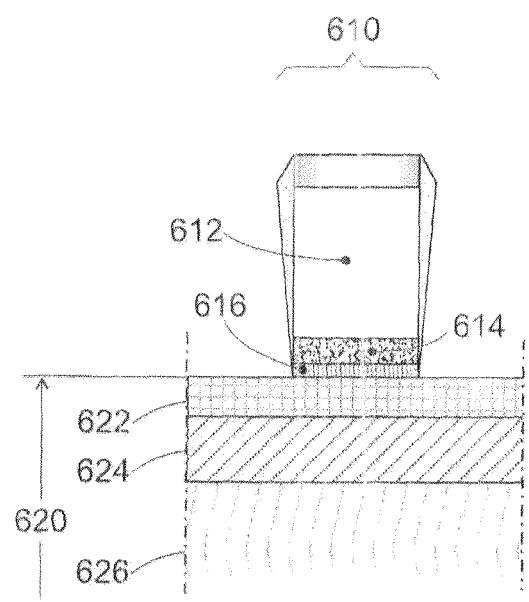
Figure 6C:
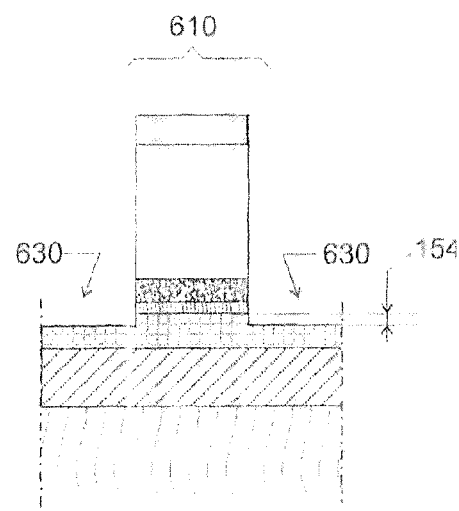
Figure 6D:
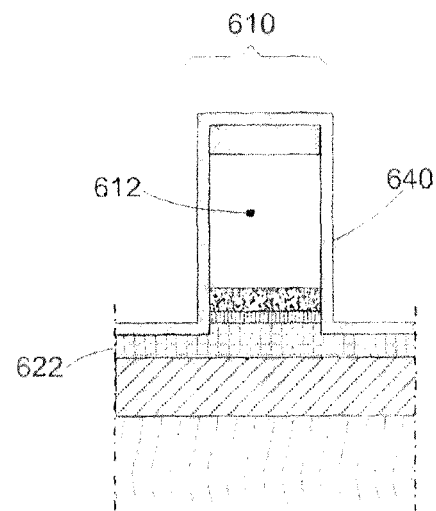
Figure 6E:
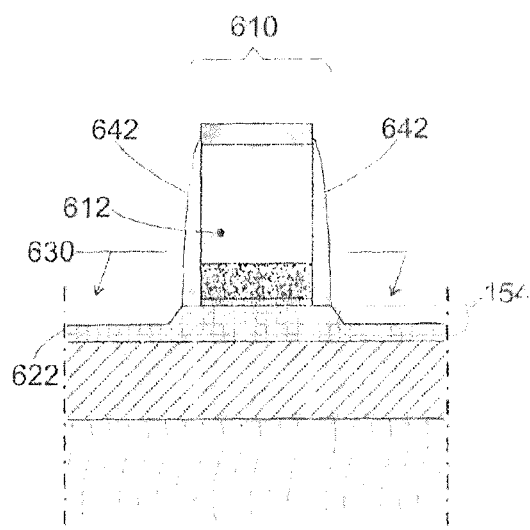
Figure 6F:
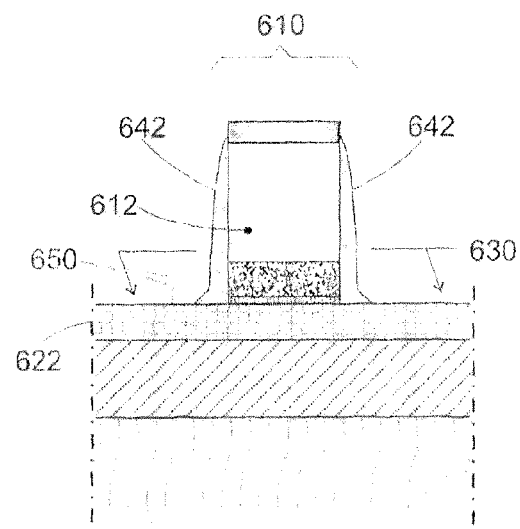
Figure 7A:
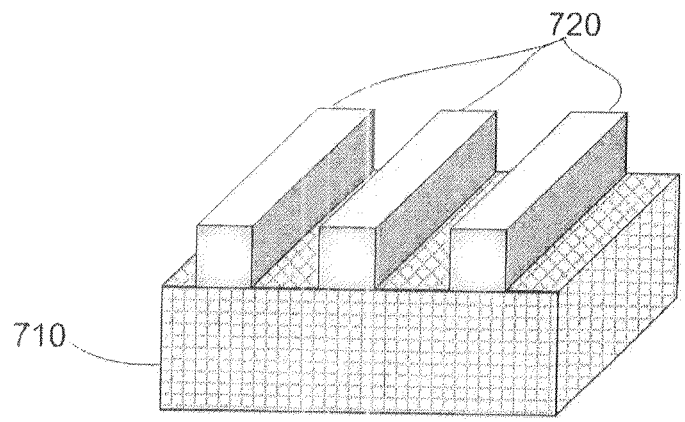
FIGS. 7a-7i show the steps of forming a MOSFET transistor of the type FinFET.
Figure 7B:
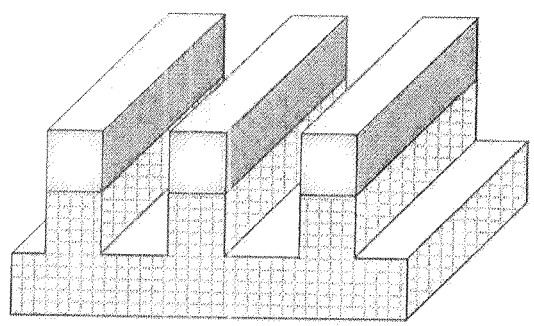
Figure 7C:
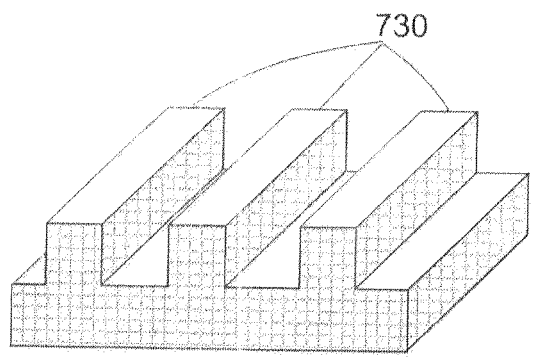
Figure 7D:
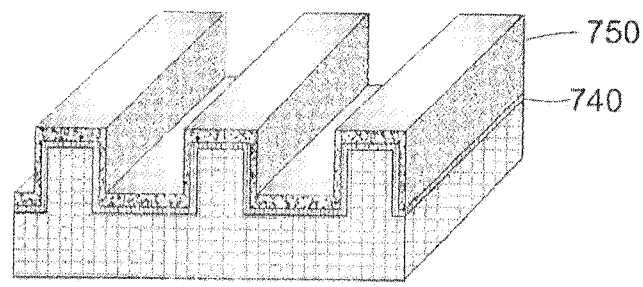
Figure 7E:
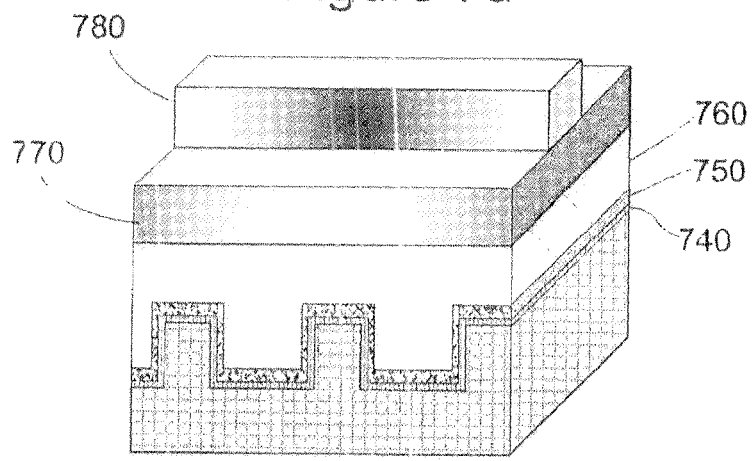
Figure 7F:
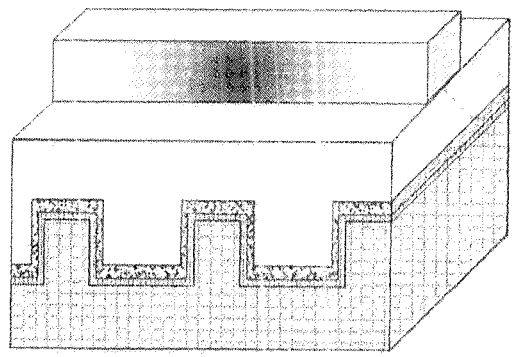
Figure 7G:
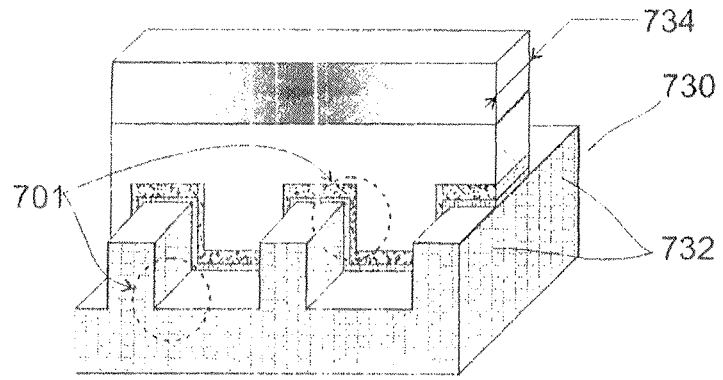
Figure 7H:
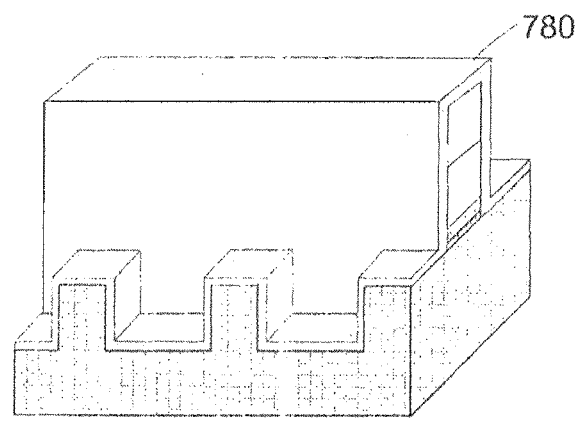
Figure 7I:
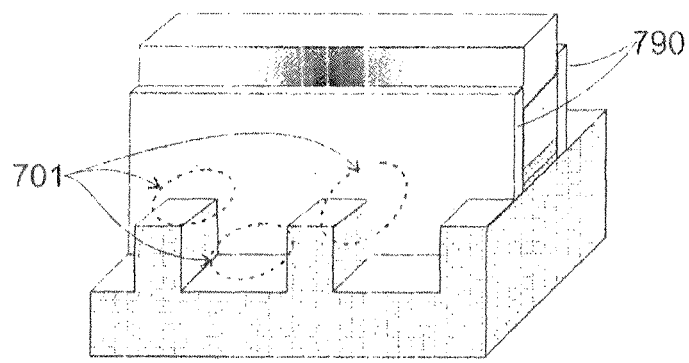

This type of anisotropic etching is very useful for producing, for example the gate spacers in a MOSFET transistor as described specifically in FIG. 6d.

However, isotropic etching is often required for various applications and in particular for producing FinFET type transistors described above. It must be possible then to remove the material on the flanks of the patterns.

With the method of the invention, in the case of an implantation from plasma, a method for executing isotropic etching, which requires the step 810 of modifying the layer to be etched to be isotropic too, consists in using the option of modification from so-called immersion plasma as described above. Such type of plasma has the specificity of being able to be set to perform an anisotropic implantation or to perform an isotropic implantation.

Figure 24A:
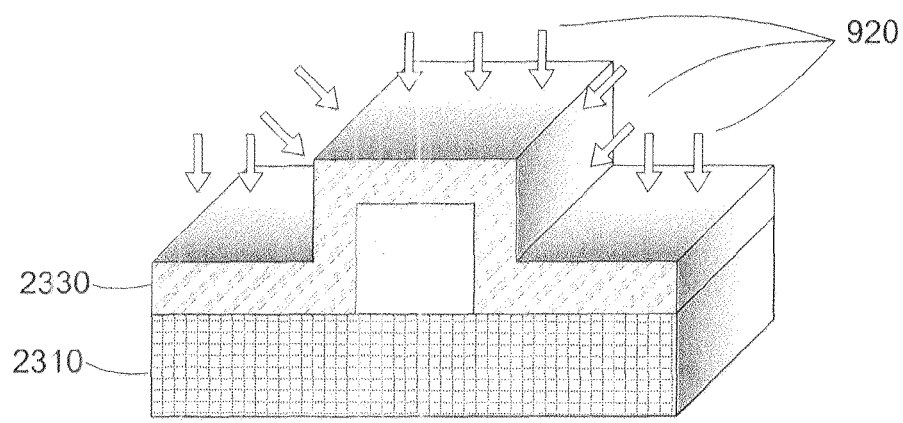
FIGS. 24a to 24c illustrate the case of etching executed from immersion type plasma that has been set so that the implantation is carried out isotropically.
Figure 24B:
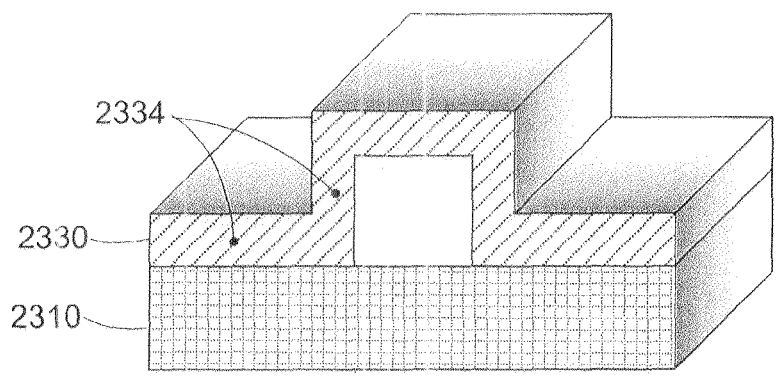
Figure 24C:
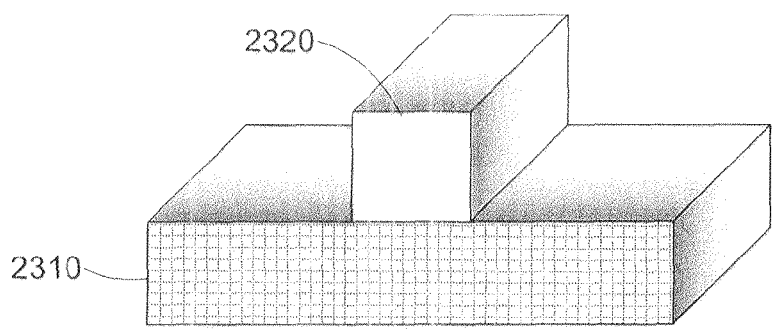

FIGS. 24a to 24c illustrate the case of etching executed from immersion type plasma that has been set so that the implantation is carried out isotropically. In this case, as shown in FIG. 24a, the modification is not directional, the implantation 920 of the layer 2330 is also executed on the flanks of the patterns 2320. As shown in FIG. 24b, the layer 2330 is totally completely modified 2334 both on the horizontal and the vertical parts of the layer to be etched upon completion of such operation. FIG. 24c shows that the modified layer 2334 forming this film is then completely removed upon completion of step 820 of the method of the invention. This figure is similar to FIG. 23b. In this example, the layer 2330 is thus modified over its entire thickness. Thus, after removing the whole original 2330 layer is removed.

Figure 25A:
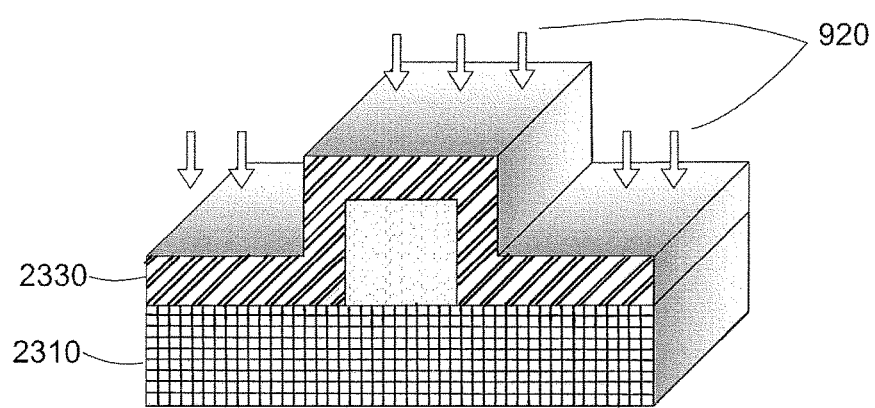
FIGS. 25a and 25b illustrate the case where the implantation of the light species in plasma is directional.
Figure 25B:
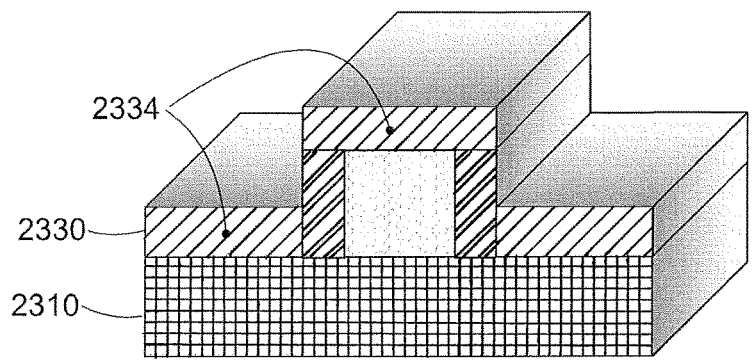

FIGS. 25a and 25b illustrate the opposite case where the implantation of the light species is directional. As shown in FIG. 25a, the ion bombardment 920 is substantially vertical in this figure, i.e. perpendicularly to the plane of the layer of the device being produced. Only the horizontal surfaces 2334 are then modified as shown in FIG. 25b.

The final result is as shown above in FIG. 23c. So after removing the modified layer, the layer to be etched that remains in place is limited to the surfaces parallel to the implantation direction. In this example, the layer to be etched is removed everywhere outside the flanks of the pattern and remains in place on the flanks. This embodiment proves very efficient for example to achieve gate spacers of a MOSFET transistor more particularly as described in FIG. 6d.

It should be noted here that the embodiments illustrated in FIGS. 20a to 23c and 25a to 25 apply equally to light ion implantations performed by implanters or by plasma. All the characteristics relating to such implantations and to such removing of the modified layer which are generated by such locations can thus be combined with the characteristics of the embodiments of FIGS. 20a-23c and 25a-25.

The option of precisely controlling the thickness of the unmodified layer 2330 remaining on the flanks may be chosen. For this purpose, after the first implantation in a direction perpendicular to the plane of the substrate 2310, at least one second implantation, inclined relative to the direction of the first one, so as to modify the layer 2330 placed on the flanks can be executed. This second implantation is so configured that only a portion of the thickness of the layer 2330 is modified. Thus, on the flanks, one part only of the thickness of this layer 2330 is etched during the step of removing whereas, outside the flanks, the whole thickness of this layer 2330 is etched during the step of removing. The result obtained is similar to that of FIG. 23c, with a controlled thickness being taken on the flanks. The thickness of the layer 2330 on the flanks is taken in a direction perpendicular to the covered flanks. With respect to the figures, the thickness of the layer 2330 to the flanks is taken along the horizontal.

As already mentioned above, in order to choose the implantation parameters and to determine the behaviour of the material to be etched in the type of implanter selected, the persons skilled in the art will preferably execute, beforehand, "full plate" tests so as to draw behavioural curves comparable to those of FIGS. 14 and 15. The ion energy and dose to be used to reach the desired thickness of the material to be modified will be deduced therefrom. The method for removing the modified layer forming the film which is the most suitable among those which have been described will also be chosen therefrom: wet or dry cleaning and wet etching i.e. the one that best ensures the selective removing of the film formed by the modified layer as compared to the other layers exposed to etching.

FIGS. 26a-26f disclose an optional modification of the layer to be etched which applies when an implanter is used, as already described in FIGS. 10b to 11b, for implanting the light species during the step 810 of the method of the invention and obtaining an isotropic etching in spite of the fact that the ion beam is very directional.

Figure 26A:
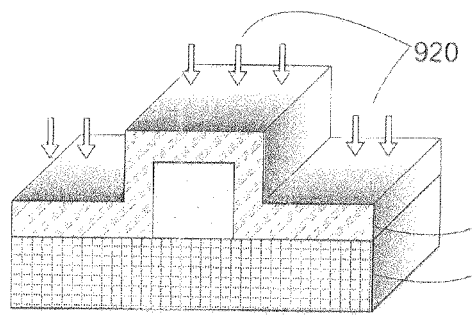
FIGS. 26a-26f disclose an optional modification of the layer to be etched which applies in the case where an implanter and a directional ion beam are used in order to obtain isotropic etching.
Figure 26B:
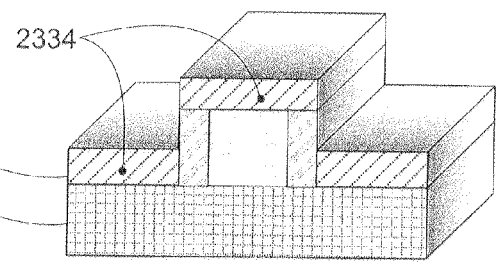

FIGS. 26a and 26b are identical to FIGS. 25a and 25b which have just been described.

Figure 26C:
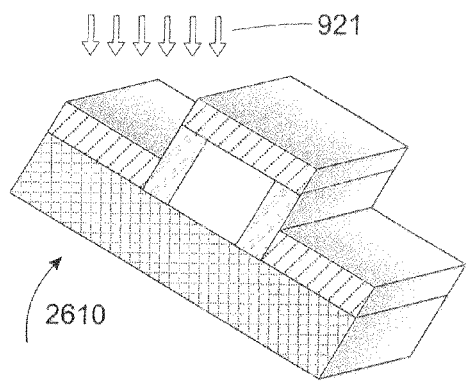
Figure 26D:
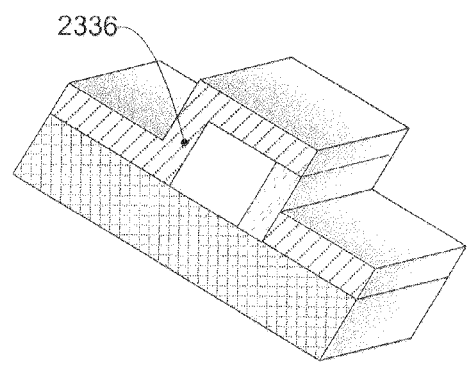
Figure 26E:
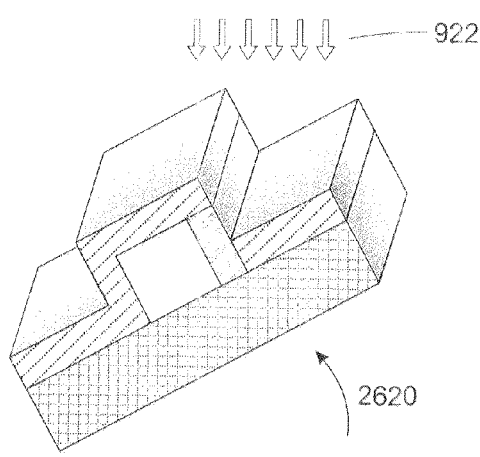
Figure 26F:
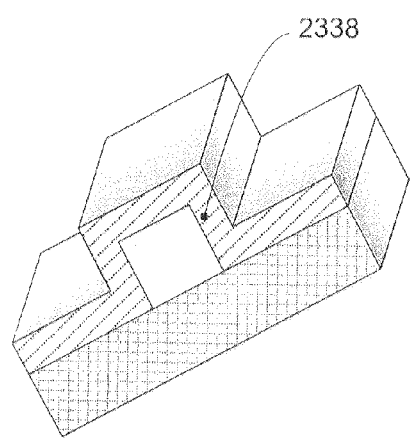

To be able to modify the flanks of the patterns, in an implanter, a second implantation 921 is then performed, after inclining 2610 the target in the implantation chamber, i.e. the substrate being manufactured, as shown in FIG. 26c. This is aimed at exposing a side of the patterns to be etched. As already mentioned in FIG. 10b, advantage is taken from the fact that, in the case of an implanter, the target can be oriented at best both in rotation and in inclination, to expose all the areas to be etched relative to the ion beam. The result is as shown in FIG. 26d. The material to be etched is modified in the areas 2336 exposed to the directional bombing of the implanter. As shown in FIGS. 26e and 26f, the implantation operation 922 is repeated after inclining the substrate 2620 to expose the other side of the patterns and to modify 2338 the material in the exposed regions. The above operations may have to be repeated, with different orientations, as many times as necessary to expose all the surfaces to be etched.

The final result is the same as what has been described in FIG. 24b where non-directional plasma was used. The complete removing of the layer to be etched is then executed, as in FIG. 24c.

Optionally, and as previously mentioned, it can be chosen to precisely control the thickness of the unmodified layer 2330 remaining on the flanks. For this purpose, the implantations performed while the substrate is inclined so as to implant the flanks is adjusted, in particular as regards dose and energy, so that only a portion of the thickness of the layer 2330 present on the flanks is modified. Thus, on the flanks, only a part of the thickness of this layer 2330 is etched during the step of removing whereas, outside the flanks, the whole thickness of this layer 2330 is etched during this step. The result obtained is similar to that of FIG. 23c, with a controlled thickness being taken on the flanks.

Two specific embodiments making it possible to retain all or a portion of the layer to be etched on the flanks of a pattern have been described above. These embodiments involve an isotropic implantation with immersion plasma or several anisotropic implantations in different directions.

A particularly advantageous application of such embodiments relates to the production of spacers made of, silicon nitride on the flanks of a pattern forming the gate of a MOSFET, for example.

In this example, the layer to be etched is a silicon nitride layer deposited onto a silicon-based gate and onto a layer, based on silicon too, whereon the gate is positioned.

The implantation, in particular the energy thereof, the concentration and the nature of the dopant species or the dose used and the duration of the implantation process, are so provided that the modified nitride layer can be selectively etched with respect to the rest of the nitride layer, i.e. the unmodified nitride layer, and the layer underlying the gate upon removing.

According to one option, the step of modifying the silicon nitride layer is preceded by a main step of anisotropic etching which comprises dry etching in methyl fluoride-based plasma (CH3F).

According to one option, the step of removing the film formed of the implanted silicon nitride layer is performed by selective wet etching relative to said semiconductor material, obtained by using a hydrofluoric acid-based (FH) or phosphoric acid-based (H3P04) solution. Alternately, the step of removing the film formed of the implanted silicon nitride layer is performed by dry etching in plasma formed in a confined area from nitrogen trifluoride (NF3) and ammonia (NH3). For example, dry etching comprises: a step of etching consisting in the forming of solid salts; a step of sublimation of the solid species.

According to one option, a single step of modifying is carried out so as to modify the silicon nitride layer throughout its thickness outside the flanks of the gate and not to modify the whole thickness of the silicon nitride layer on the flanks of the gate.

Another particularly advantageous application of the invention relates to the production of patterns in a first layer which is preferably an anti-reflective layer. This anti-reflective layer is for example silicon based. It is then commonly noted SIARC (ARC for "Anti Reflective Coating").

According to this option, at least one photoresist-based masking block is formed on the first layer.

An implantation is then carried out in areas of the first layer located on the periphery of said masking block, using at least one dopant species. The dopant species is so selected that the doped areas are liable to be etched selectively with respect to the first layer, typically made of anti-reflective material.

The doped regions of said first thin layer are then executed selectively with respect to the non-doped areas.

The implantation, more particularly the energy thereof, the concentration of the dopant species or the dose used and the duration of the implantation process, are so provided that said doped areas located on the periphery of said masking block and a non-implanted region of said thin layer located under the masking block have a boundary positioned right above or in the extension of the side face(s) of said masking block.

Advantageously but optionally, this embodiment may also have the following optional characteristics:

Advantageously, a protective layer covering the first layer and said masking block is deposited prior to the implantation. In addition, the protective layer, in particular the composition and the thickness thereof, is so provided that said doped areas located on the periphery of said masking block and a non-implanted region of said first layer located under the masking block have a boundary positioned directly above or in the extension of the side face(s) of said masking block. Thus, this protective layer makes it possible to obtain an etching executed right above said flanks.

Said first layer may be an anti-reflective SiARC or a Si-based layer.

The method can be applied to a silicon-based layer such as, for example, a layer made of Si02, or SiON or SiOC.

Said protective layer can have a low thickness and can be between 1 nanometer and 3 nanometers.

Too high a thickness of the protective layer prevents a boundary to be defined between the doped areas and the non-doped areas right above or in the extension of the side face(s) of said masking block.

Said dopant species can be based on hydrogen, which makes it possible to form doped regions having Si—H bonds in the case where the first layer contains Si.

The selective etching can thus be carried out, for example, using a hydrofluoric acid-based (HF) wet bath diluted in de-ionized water.

Doping can be achieved with low implantation energy in particular between 100 eV and 600 eV.

Figure 27:
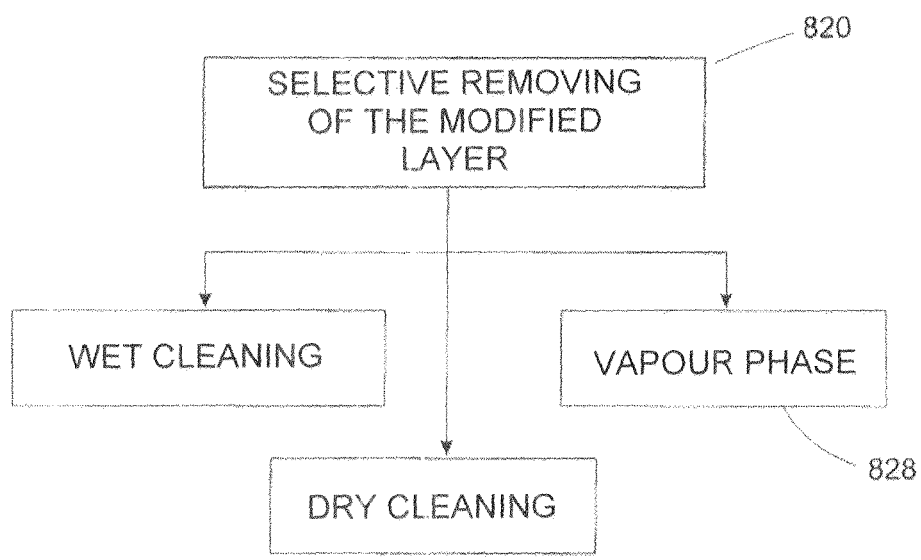
FIG. 27 illustrates a further optional removing 820 of the modified layer.
Figure 27:
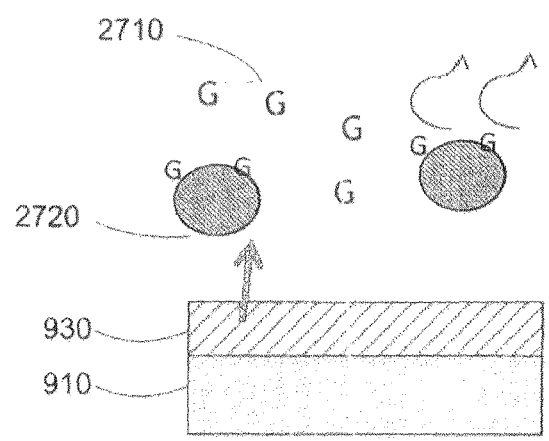

FIG. 27 illustrates a further option of removing 820 the film 930. This is carried out in the vapor phase 828 in presence of a gas 2710 which directly reacts 2720 with the film formed by the modified layer. All the gases which make it possible to form volatile products reacting with the material to be etched may be used. For example, for etching a silicon layer, an implantation of hydrogen (H) may be used and the gas used for the removing may be HF.

The etching process of the invention thus has many advantages:

a high etching selectivity with respect to the materials which have not been modified by implanting light species;

the possibility of etching a large number of materials;

no spraying of the materials exposed during the steps of implanting and removing the modified layer forming the film;

the possibility of executing a directional anisotropic etching, thereby enabling to obtain a high aspect ratio;

no forming of a passivation layer without the major disadvantage associated thereto, i.e. the absence of control of the critical dimensions;

utilisation of easily controllable non-polluting chemistry;

not having to resort to high etching temperatures that are potentially damaging to the devices being produced;

the implementation of a simple etching process mainly based on the modification of the material to be etched only requiring a control of ion doses to be used and energy to be communicated thereto;

no use of a systematic cleaning of the walls of the etching chamber which was necessary to avoid the observed deviations of the earlier etching processes and the lack of reproducibility between plasma chambers.

The invention is not limited to the above-mentioned methods and embodiments, but extends to all the embodiments within the scope of the claims.

The invention claimed is:

1. A microelectronic method for etching a layer to be etched, comprising:
    modifying the layer to be etched to a depth extending from a surface of the layer to be etched and down to at least a portion of a thickness of the layer to be etched to form a film, the modifying comprising implanting light ions into the layer to be etched, the implanting being carried out by a plasma comprising light ions, and the light ions being selected from among helium and hydrogen; and
    removing the film by a selective etching of the film relative to at least one layer underlying the film,
    wherein the layer to be etched covers patterns including flanks, and the implanting of the light ions is performed anisotropically along a direction that is substantially parallel to a surface of the flanks.

2. The method according to claim 1, wherein the implanting is carried out such that the implanted light ions are distributed without interruption from the surface of the layer to be etched down to the depth.

3. The method according to claim 2, wherein the depth ranges from 1 nm to 30 nm.

4. The method according to claim 1, wherein energy, duration, and dose of the implantation are provided such that the film can be selectively etched relative to the at least one layer underlying the film.

5. The method according to claim 1, wherein the modifying of the layer to be etched is executed to a depth corresponding to a portion only of the thickness of the layer to be etched, so that removing the film removes only a portion of the thickness of the layer to be etched.

6. The method according to claim 1, wherein the modifying of the layer to be etched is executed to a depth corresponding to an entire thickness of the layer to be etched, so that removing the film removes the entire layer to be etched.

7. The method according to claim 1, wherein the removing the film comprises at least one of: wet cleaning, dry cleaning, and plasma etching.

8. The method according to claim 1, wherein the removing the film comprises at least vapor phase etching using a gas reacting with the film to form a volatile reaction product.

9. The method according to claim 1, wherein the implanting of light ions comprises adding to the plasma a gas containing one of the following gases: helium (He), hydrogen (H2), argon (Ar), or nitrogen (N2).

10. The method according to claim 1, wherein the layer to be etched is made of a semiconductor-based material comprising: silicon (Si), germanium (Ge), and/or silicon germanium (SiGe).

11. The method according to claim 10, wherein the layer to be etched is an oxide or a nitride of the semiconductor material.

12. The method according to claim 1, wherein the layer to be etched is made of a type III-V and II-VI composite semiconductor material obtained by combining, respectively, two elements or more in columns II and III, and two elements or more in columns V and VI, of the Periodic Table.

13. The method according to claim 1, wherein the layer to be etched is a metal oxide or boron-doped carbon (B:C).

14. The method according to claim 1, wherein the material of the layer to be etched is a metal or a metal alloy.

15. The method according to claim 1, wherein the modifying comprises, prior to the implanting light ions, an oxidation of a portion of the layer to be etched from the surface thereof.

16. The method according to claim 1, wherein the modifying comprises, after the implanting the light ions and prior to the removing the film, an oxidation of a portion of the layer to be etched from the surface thereof.

17. The method according to claim 1, wherein the modifying comprises an oxidation of a portion of the layer to be etched from the surface thereof simultaneously with the implanting of light ions.

18. The method according to claim 1, wherein the implanting into the layer to be etched is executed through a mask.

19. The method according to claim 18, wherein plural cycles of the method are carried out, with each cycle comprising an implantation into the layer to be etched through the mask and a removal of the film by selective etching of the film relative to at least an unmodified portion of the layer to be etched.

20. The method according to claim 18, wherein the removal is executed so that the selective etching etches the film without selectivity relative to the mask, so that, upon removing, a mask thickness substantially equal to a thickness of the film is etched.

21. The method according to claim 18, wherein the removal is executed so that the selective etching etches the film rather than the mask so as not to consume the mask during the removing or to consume a mask thickness smaller than a thickness of the film during the removal.

22. The method according to claim 1, wherein the modifying the layer to be etched is executed to a depth corresponding to an entire thickness of the layer to be etched taken along a direction that is substantially perpendicular to the direction of the anisotropic implantation, so that removing the film removes the entire layer to be etched outside the flanks of the patterns and leaves at least a portion of the layer to be etched covering the flanks of the patterns.

23. The method according to claim 22, wherein the layer comprises silicon nitride and the removing the film is carried out by dry etching in plasma formed in a confined chamber from nitrogen trifluoride (NF3) and ammonia (NH3), and wherein dry etching comprises: etching in forming solid salts and a sublimation of a solid species.

24. The method according to claim 1,
wherein the layer to be etched is covered with at least one masking block,
wherein the masking block and the layer to be etched are covered with a protective layer,
wherein the implanting is carried out to implant the light ions at least in areas of the layer to be etched located at a periphery of the masking block, with the light ions being selected so that the implanted areas are etched selectively relative to a rest of the layer to be etched not located at the periphery, and
wherein the implanting further comprises providing a concentration in light ions or dose used and a duration of the implanting so that doped areas located at the periphery of the masking block and a non-implanted region of the layer to be etched located beneath the masking block have a border positioned directly above or in line with one or more side faces of the masking block.

25. The method according to claim 24, wherein the layer to be etched is an anti-reflective layer.

26. The method according to claim 1, wherein the modifying and the removing the layer to be etched are performed in a same plasma reactor.

27. A microelectronic method for etching a layer to be etched, comprising:
modifying the layer to be etched to a depth extending from a surface of the layer to be etched and down to at least a portion of a thickness of the layer to be etched to form a film, the modifying comprising implanting light ions into the layer to be etched; and
removing the film by a selective etching of the film relative to at least one layer underlying the film,
wherein the modifying comprises, after the implanting the light ions and prior to the removing the film, oxidizing a part of the layer to be etched from the surface thereof,
wherein the layer to be etched covers patterns including flanks, and the implanting of the light ions is performed anisotropically along a direction that is substantially parallel to a surface of the flanks.

28. The method according to claim 27, wherein the light ions are selected from among helium (He) and hydrogen (H2).

* * * * *